United States Patent
van Hanxleden Houwert

(10) Patent No.: US 12,414,264 B2
(45) Date of Patent: Sep. 9, 2025

(54) IMMERSIVE COOLING UNIT FOR COOLING ELECTRONIC COMPONENTS AND METHOD OF USING THE SAME

(71) Applicant: Stem Technologies | iXora Holding B.V., Ede (NL)

(72) Inventor: Vincent Daniël van Hanxleden Houwert, Ede (NL)

(73) Assignee: Stem Technologies | iXora Holding B.V., Ede (NL)

( * ) Notice: Subject to any disclaimer, the term of this patent is extended or adjusted under 35 U.S.C. 154(b) by 56 days.

(21) Appl. No.: 18/272,725

(22) PCT Filed: Jan. 20, 2022

(86) PCT No.: PCT/NL2022/050025
§ 371 (c)(1),
(2) Date: Jul. 17, 2023

(87) PCT Pub. No.: WO2022/158975
PCT Pub. Date: Jul. 28, 2022

(65) Prior Publication Data
US 2024/0130074 A1   Apr. 18, 2024

(30) Foreign Application Priority Data

Jan. 21, 2021 (NL) .................................... 2027361
May 27, 2021 (NL) .................................... 2028314
(Continued)

(51) Int. Cl.
*H05K 7/20* (2006.01)
(52) U.S. Cl.
CPC ..... *H05K 7/20236* (2013.01); *H05K 7/20245* (2013.01); *H05K 7/20772* (2013.01)

(58) Field of Classification Search
CPC ........... H05K 7/20236; H05K 7/20636; H05K 7/20772–20781
See application file for complete search history.

(56) References Cited

U.S. PATENT DOCUMENTS

| 4,572,286 A | 2/1986 | Fujii et al. |
| 10,568,234 B1 * | 2/2020 | Mao .................. H05K 7/20781 |

(Continued)

FOREIGN PATENT DOCUMENTS

| DE | 102007013906 A1 | 10/2008 |
| EP | 0580412 A1 | 1/1994 |

(Continued)

OTHER PUBLICATIONS

International Search Report for PCT Application No. PCT/NL2022/050025 mailed Jul. 7, 2022, 9 pages.

(Continued)

*Primary Examiner* — Zachary Pape
(74) *Attorney, Agent, or Firm* — Bret E. Field; Bozicevic, Field & Francis LLP

(57) ABSTRACT

The present invention is related to an immersive cooling unit (1), comprising at least one closed heating channel (2), defined by at least one circumferential heating channel wall having a start and an end, accommodating one or more printed circuit boards (10), comprising one or more heat dissipating electronic components (5), at least one closed cooling channel (3), defined by at least one circumferential cooling channel wall (6), wherein a start of the cooling channel (3) is connected to an end of the heating channel (2), and wherein an end of the cooling channel (3) is connected to the start of the heating channel (2) such that a closed circuit is formed between the channels (2,3), a liquid coolant, for cooling the electronic components (5), said coolant at least filling the channels (2, 3) and submerging the printed circuit board (10), wherein the channels (2, 3) each allow a (Continued)

coolant flow having at least a vertical component wherein at least a portion (7) of the cooling channel wall (6) is formed by a heat conducting material, said portion (7) allowing an exchange of heat between a part of the coolant in contact with an interior side of said cooling channel wall portion (7) and a surrounding (8) in contact with an exterior side of said cooling channel wall portion (7). The invention is further related to a cooling unit (1) and a holder (15), and a method for using the cooling unit (1).

17 Claims, 11 Drawing Sheets

(30) Foreign Application Priority Data

| Sep. 8, 2021 | (NL) | 2029151 |
| Dec. 1, 2021 | (NL) | 2029988 |
| Dec. 26, 2021 | (NL) | 2030162 |

(56) References Cited

U.S. PATENT DOCUMENTS

| 10,716,238 | B2* | 7/2020 | Brink | H05K 7/20772 |
| 10,999,951 | B2* | 5/2021 | Tsunoda | H05K 7/20772 |
| 11,116,106 | B2* | 9/2021 | Harada | H05K 7/20272 |
| 2007/0034360 | A1 | 2/2007 | Hall | |
| 2010/0101759 | A1 | 4/2010 | Campbell et al. | |
| 2014/0146467 | A1 | 5/2014 | Campbell et al. | |
| 2017/0071079 | A1 | 3/2017 | Krishnan et al. | |
| 2017/0094842 | A1 | 3/2017 | Standing | |
| 2017/0223870 | A1 | 8/2017 | Smith | |
| 2017/0303440 | A1 | 10/2017 | Shimasaki | |
| 2020/0214169 | A1 | 7/2020 | Tsunoda | |
| 2020/0267872 | A1 | 8/2020 | Harada et al. | |

FOREIGN PATENT DOCUMENTS

| EP | 2487327 A1 | 8/2012 | |
| EP | 2803813 A1 | 11/2014 | |
| EP | 3177125 A2 | 6/2017 | |
| EP | 3177125 A3 | 8/2017 | |
| EP | 3380907 A1 | 10/2018 | |
| JP | 2019220527 A * | 12/2019 | F28D 1/0213 |
| WO | WO2017089313 A1 | 6/2017 | |

OTHER PUBLICATIONS

Written Opinion for PCT Application No. PCT/NL2022/050025 mailed Jul. 7, 2022, 32 pages.

* cited by examiner

IMMERSIVE COOLING UNIT FOR COOLING ELECTRONIC COMPONENTS AND METHOD OF USING THE SAME

The present invention is related to an immersive cooling unit for cooling electronic components, the invention is further related to a method of using the same.

Typical examples of immersive cooling systems are known. One of these examples is described in the European patent application EP 3380907, which describes a container, said container having a bottom and a wall surface. Components are mounted inside the container, and are subsequently submerged in a liquid which extracts heat from the components. Two heat exchangers are present in the system to cool the heated liquid. The heat exchangers and the electronic components are separated by walls. Due to these walls a self-induced double and symmetrical circulation of the liquid is caused. Although this system provides benefits, the system lacks in the modularity and/or efficiency.

It is a goal of the present invention at least provide an alternative to the prior art. In an embodiment, it is a goal of the present invention to provide a more modular and/or efficient liquid cooling system, taking away the aforementioned disadvantages of the prior art.

To this end the present invention provides an immersive cooling unit, for cooling electronic components, comprising at least one closed heating channel, defined by at least one circumferential heating channel wall having a start and an end, accommodating one or more printed circuit boards, wherein one or more heat dissipating electronic components are provided on each printed circuit board, or accommodating one or more batteries or battery cells, or at least one heat dissipating electronic component, at least one closed cooling channel, defined by at least one circumferential cooling channel wall, wherein a start of the cooling channel is connected to an end of the heating channel, and wherein an end of the cooling channel is connected to the start of the heating channel such that a closed circuit is formed between the channels, a liquid coolant, for cooling the electronic components, said coolant at least filling the channels and submerging the printed circuit board, or batteries or battery cells, wherein the channels each allow a coolant flow having at least a vertical component, wherein at least a portion of the cooling channel wall is formed by a heat conducting material, said portion allowing an exchange of heat between a part of the coolant in contact with an interior side of said cooling channel wall portion and a surrounding in contact with an exterior side of said cooling channel wall portion.

The present invention also provides an immersive cooling unit, for cooling electronic components, comprising at least one closed heating channel, defined by at least one circumferential heating channel wall having a start and an end, said at least one heating channel configured for accommodating one or more printed circuit boards, wherein one or more heat dissipating electronic components are provided on each printed circuit board, at least one closed cooling channel, defined by at least one circumferential cooling channel wall, wherein a start of the cooling channel is connected to an end of the heating channel, and wherein an end of the cooling channel is connected to the start of the heating channel such that a closed circuit is formed between the channels, wherein the at least one heating and cooling channel are configured for holding a liquid coolant, for cooling the electronic components, said coolant at least filling the channels wherein at least a portion of the cooling channel wall is formed by a heat conducting material, said portion allowing an exchange of heat between an interior side of said cooling channel wall portion and a surrounding in contact with an exterior side of said cooling channel wall portion. The skilled person would readily realize that this embodiment according to the present invention may be used separately or in combination with any of the embodiments presented in the present application.

The configuration of the closed heating and cooling channels, that is, the connections between an end of the heating channel and a start of the cooling channel and between an end of the cooling channel and the start of the heating channel draw up a closed circuit that allows a convective circulation of coolant during use. The present invention is in particular not related to open systems wherein the coolant is in contact with the surrounding. Each channel allows a flow of coolant having at least a vertical component, said vertical component preferably being introduced by means of convection due to the difference in temperature of the coolant during use. Preferably the difference in temperature is introduced by the heating of the coolant by the electronic components in the heating channel and the cooling of the coolant by the heat exchange between the coolant and a surrounding in the cooling channel. The electronic components on the printed circuit boards can be any heat dissipating electronic such as high powered MOSFETs or processing unit or storage units such as CPU, GPU, NVMe, FPGA, or amplifiers, Rontgen power units, ASIC, MPU, MCU's, Photonics and/or Optics, or specially adapted capacitors, however the present invention is not limited to these examples. Said components could be placed on a printed circuit board, which printed circuit board is accommodated inside the heating channel. The printed circuit board is placed such that at least the electronic components thereon are in thermal contact with the coolant that fills the closed circuit. During use the electronic components will generate heat, which on its turn will be transferred to the coolant surrounding said heat generating component. The heated coolant rises upward due to convection, initiating a convective flow having at least a vertical component. Once the coolant reaches the end of the heating channel, it enters the start of the cooling channel. Since at least a portion of the cooling channel wall is drawn up by a heat conducting material an efficient transfer of heat can take place between coolant in contact with an interior part of said portion of the cooling channel wall made of conductive material, and a surrounding that is in contact with an exterior part of said portion of the cooling channel wall made of the conductive material. Preferably, said surrounding has a temperature lower than the temperature of the coolant that is in contact with the interior part of the cooling channel wall portion such that the coolant is cooled. Preferably the conductive material is a metal, more preferably a stainless steel, aluminium, or copper, however the invention is not limited to these materials, any material having the property to efficiently allow an exchange of heat is suitable. To this end, efficiently should be understood as a material allowing a high heat flow, for example by having a high thermal conductivity for a wide range of temperatures. Preferably, the entire cooling channel wall that separates the coolant from the surrounding is formed by said heat conducting material. Due to the coolant being cooled down in the cooling channel, the coolant flows in a downwards direction, wherein the vertical component in the flow in the cooling channel is in the opposite direction compared to the vertical component in the heating channel. Once the coolant reached the end of the cooling channel, the coolant flows into the heating channel, thereby starting the aforementioned circulation over again, and hence a circulating flow is introduced during use. Preferably the channels extend in substantially the same direction, more preferably substantially parallel to each other, as such the circulating flow introduced by natural convection could be more easily introduced.

Preferably, the at least one heating channel and the at least one cooling channel are separated by a heat insulating wall, said heat insulating wall forming at least a part of the circumferential cooling channel wall and at least a part of the circumferential heating channel wall of the channels said insulating wall separates, wherein said insulating wall prevents heat exchange between said channels. This increases the temperature difference in the two channels which enhances the cooling capabilities and is beneficial to the convective flow. In a different preferred embodiment the at least one heating channel and the at least one cooling channel each have a heat insulating wall, wherein the heat insulating walls are preferably parallel and either spaced apart, or against each other, wherein said walls prevent a transfer of heat between the heating and cooling channel. In case the insulating walls are spaced apart, a further insulating material is preferably placed in between said walls. In order to create a more compact cooling unit however it could be preferred to introduce a single heat insulating wall, which is a mutually shared wall of both channels, such that the heat insulating wall forms part of the circumferential heating channel wall and the circumferential cooling channel wall. Preferably the heat insulating wall does not obstruct the flow of the coolant and prevents transfer of heat from the heating channel to the cooling channel. To keep the natural convection flow of the dielectric liquid circulating, the insulation wall in the immersive cooling unit which separates the heating and cooling channel creates the described chimney effect, pulling the heated liquid upward. This chimney effect may also be achieved without the heat insulating wall in cases where the PCB itself is covering essentially the entire size of where the insulation wall would otherwise be. This can save weight for the total system and allows the immersive cooling units to be slightly less wide, resulting in more cooling units next to each other in one holder according to the invention. In another preferred embodiment the cooling unit comprises at least two closed cooling channels, each defined by at least one circumferential cooling channel wall, and wherein a start of each cooling channel is connected to an end of the heating channel, and wherein an end of each cooling channel is connected to the start of the heating channel such that a closed circuit is formed between the channels. Preferably at least a portion of each of the cooling channel walls is formed by a heat conducting material, said portion allowing an exchange of heat between a part of the coolant in contact with an interior side of said cooling channel wall portions and a surrounding in contact with an exterior side of said cooling channel wall portions. To this end the heating channel is preferably positioned between the at least two cooling channels, more preferably in a parallel configuration wherein the end of the heating channel is in accordance with the location of the start of the two cooling channels. In yet a different embodiment a plurality of heating channels and cooling channels could be used. It is preferred that at least one heating channel and more preferably all heating channels are adjacent to at least one cooling channel. Preferably the end of the at least one, and more preferably all heating channels are connected to a start of the at least one adjacent cooling channel, and the ends of all heating channels are connected to the start of the least two adjacent cooling channels. In the latter embodiment at least one, but preferably each of the cooling channels has a portion of its circumferential cooling channel wall formed by a heat conductive material to allow the coolant that is in contact with an interior side of said portion to exchange heat with a surrounding in contact with an exterior side of said portion for cooling the coolant.

In a preferred embodiment the at least one heating channel and each of the at least two cooling channels are separated by a heat insulating wall, said heat insulating wall forming at least a part of one of the circumferential cooling channel walls and at least a part of the circumferential heating channel wall of the channels said insulating wall separates, wherein said insulating wall prevents heat exchange between said channels. This increases the temperature difference in the heating channel and the at least two cooling channels which enhances the cooling capabilities. In a different preferred embodiment the at least one heating channel is provided with two heat insulating walls, and the cooling channels are provided with a heat insulating wall, wherein the heat insulating walls of each cooling channel is facing towards one of the heat insulating walls of the heating channel. To this end preferably, the heat insulating walls are parallel and either spaced apart, or against each other, wherein said walls prevent a transfer of heat between the heating and cooling channel. In case the insulating walls are spaced apart, a further insulating material is preferably placed in between said walls. In order to create a more compact cooling unit however it could be preferred to introduce at least two single spaced apart heat insulating wall, which are preferably mutually shared walls between the heating channel and each of the cooling channels, such that the heat insulating walls form part of the heating channel wall and a part of each of the cooling channel walls. As such, the heating channel is separated from each of the at least two cooling channels by an insulating wall. Preferably the heat insulating walls do not obstruct the flow of the coolant.

In a particular preferred embodiment at least one heat insulating wall is connected to at least one printed circuit board. The exact attachment depends on the amount of circuit boards and the placement in the heating channel. The printed circuit boards are preferably placed parallel to each other. The heat insulating walls can be connected directly or indirectly to the printed circuit boards. The heat insulating walls can be attached in a manner parallel to the printed circuit boards or perpendicular to the printed circuit boards, depending on their orientation inside the heating channel.

In yet another preferred embodiment the printed circuit boards are vertically accommodated in the heating channel. To this end vertically accommodated should be understood as at least the plane in which the printed circuit boards extend is extending substantially vertical. This allows the coolant to easily flow over the components on the circuit boards, without said boards preventing the flow because the boards are positioned substantially parallel to the direction of the flow. In case multiple printed circuit boards are accommodated in the heating channel the boards are preferably placed parallel to each other, and extending vertically in the direction of the flow of coolant such that the coolant can pass over all printed circuit boards. Yet preferably the electronic components on the printed circuit board are arranged, in a direction from the start of the heating channel to the end of the heating channel, according to their heat generation during use, wherein the component generating the most heat is placed closest to the start of the heating channel. This could be beneficial for both the flow of the coolant and the cooling of components. The components that reach the highest temperature, or have the highest heat loss, or consume the highest power, could be placed near the start of the channel, or in particular are positioned on the printed circuit board such that upon placement of the circuit board in the heating channel said components are located near the start of the channel. This allows these components to have the biggest temperature difference with the coolant and have a high cooling rate and induce the best convective flow. Near the end of the channel the components are placed that have the lowest heat loss. In between components are arranged accordingly. This allows each component to be cooled sufficiently, and also enhances the natural convective flow.

In a preferred embodiment the cooling unit comprises a common housing, said housing comprising a bottom, a top cover, and a housing wall, wherein the circumferential heating channel wall and/or circumferential cooling channel wall form at least a part of the housing wall. Preferably, the housing is a substantially cylindrically or rectangular shaped housing. In case only one heating channel and one cooling channel is present, a part of the circumferential wall of each channel is formed by the common housing, whereas in the case two cooling channels are present a part of the circumferential wall of the outermost channels, preferably being the cooling channels, is formed by the common housing. Preferably the common housing forms the entire outside housing of the cooling unit, wherein the insulation walls form an interior portion of the circumferential walls of the channels.

To this end it is preferred that the common housing is at least partially made of conductive material to allow a transfer of heat from the coolant, in particular a part of coolant being in contact with an interior wall of the common housing, with a surrounding in contact with an exterior wall of the common housing. In a further preferred embodiment handles are provided to the top cover, for handling the cooling unit. This allows the cooling unit to be positioned on and/or into a preferred location. Preferably, at least a part of the heating channel wall and the cooling channel wall comprise insulated walls. More preferably, at least a part of the housing wall is insulated, preferably the entire common housing is insulated. Preferably, the housing wall comprises an inner housing wall and an outer housing wall, which outer housing wall may be connected to the inner housing wall. Preferably the inner and outer housing wall define an insulation space, wherein said insulation space is preferably a vacuum space, such that the interior, where the immersive cooling liquid resides, is properly insulated from the exterior. However, the insulating property may also be realised by composing a part of, or the entire cooling or heating channel wall, or housing wall out of suitable insulting material, such as Twaron. Alternatively, the insulation may be achieved by providing the exterior wall of the common housing with an insulating material, such as aerogel. By insulating the walls, the amount of heat that is contained within the immersive cooling unit, in particular the immersive cooling liquid, is increased. This in turn allows for more heat that is discharged from the components inside the immersive cooling liquid to be extracted and reused. This is mostly since less heat is leaked to the exterior. Hence, this allows for a more efficient use of the energy dissipated by components inside the immersive liquid since this solution prevents heat to leak to a surrounding. This also eliminates the requirement to cool the air in the environment in which the immersive cooling unit, or holder is located, since the holder or immersive cooling unit as such does not leak heat to its surrounding, hence saving more energy.

In a preferred embodiment the liquid coolant is a dielectric fluid. Preferably the Immersion Cooling Fluid S5 X made by Shell is used to this end, however the present invention is not limited thereto. Also other immersion cooling fluids could be used. Preferably the volume of the coolant remains substantially constant under heating and/or cooling. Preferably, the coolant has a high boiling temperature, such that the coolant does not vaporize during heating during use of the present invention. To this end the boiling temperature is at least 30 degrees Celsius, preferably at least 50 degrees, and more preferably at least 95 degrees. Preferably the flash point of the coolant is at least 140 degrees Celsius, preferably at least 190 degrees.

Preferably, the heat insulating wall is formed by a Resol or by an aerogel. These materials have very good insulating properties, can withstand high temperatures, and have a low weight which makes them suitable for forming the heat insulating wall.

In a preferred embodiment the cooling unit further comprises a valve, wherein the valve provides an access to the closed circuit formed by the at least one heating and cooling channel. The valve is preferably placed on the top cover in case a common housing is applied, otherwise the valve is preferably placed on such a position that the channels can be easily filled with cooling liquid. Preferably, the valve prevents the leakage of coolant in any position. The cooling unit is closed such that it can be transported without leaking. That is, the valve prevents fluid to escape independent on the orientation of the cooling unit, although the valve may function as a security valve as well, in which case preferably a compression chamber is provided in the closed circuit and/or housing. It is further preferable that a valve is also used for draining the liquid, however to this end also a separate cap or closable hole in the circumferential walls could be present. In a further embodiment the valve further allows gas to escape from the closed circuit, such that in case an overpressure is present due to a sudden or unexpected overheating of the coolant the closed circuit is not damaged due to expansion or high pressures.

Preferably, at least one printed circuit board and/or a System on a Chip (SoC) is configured for measuring the temperature of an inserted cooling unit, preferably the coolant temperature inside an inserted cooling unit. This allows the cooling unit to measure the temperature of the coolant, and/or the temperature of the electronic components, and/or the temperature of the coolant walls. This information may be required for determining the amount of cooling required to prevent the electronic components inside the cooling unit from being damaged. To this end the coolant unit may be provided with a communication system, such as a transceiver, that is connected either directly or indirectly, e.g. through a connector, to an external device.

In a preferred embodiment according the present invention further provided with a holder, said holder comprising at least one holding space formed by at least a holding bottom and at least one circumferential holding wall, wherein the at least one holding wall is dimensioned to receive a cooling unit, wherein a part of the holding wall facing toward the holding space is thermally connected to at least the exterior side of the cooling channel wall of an inserted cooling unit, a least one heat extracting unit, for actively extracting heat from the part of the holding wall that is thermally connected to the exterior side of the cooling channel wall of an inserted cooling unit. This allows the cooling unit to be small, and furthermore very modular, since one can have a plurality of the cooling units according to the invention, and place one in the holder in order to use it. The holder wall is preferably configured to tightly receive the circumferential wall of at least one channel, such that a thermal connection is formed between the holder wall and the channel wall. In a different embodiment it is conceivable that the holder wall is larger than the exterior dimensions of the cooling unit, and that a heat conductive material fills the gap between the exterior side of the channel walls and the interior side of the holder wall such that a good and efficient transfer of heat is enabled between the two.

Preferably, the holder comprises a plurality of holding spaces, each holding space formed by at least a holding bottom and at least one holding wall, wherein the at least one holding wall is dimensioned to receive an independent cooling unit, wherein a part of the holding wall facing toward the holding space is thermally connected to at least the exterior side of the cooling channel wall of an inserted cooling unit, wherein the heat extracting unit is a central heat extracting unit, actively extracting heat from each holding wall that is in thermally connected with the exterior side of the cooling channel wall of an inserted cooling unit. As such the modularity of the system is even further enhanced. A plurality of cooling units can be formed, each comprising one or more different printed circuit boards, each allowing a different functionality, wherein the holder is able to receive a plurality of the cooling units such that a system according to the users need could be formed.

Preferably, the holder is configured for independently and separately regulating the heat extraction rate and/or temperature of each inserted cooling unit. As such the different inserted cooling units may be cooled according to their requested cooling rate, or temperature. To this end the immersive cooling unit according to the present invention allows for a wider range of applications. For instance, a first cooling unit may be inserted in a first holding space, and a second cooling unit may be inserted in a second holding space of the holder. Both cooling units may perform different functionalities, and may have different temperatures. To this end it is preferred to independently and separately regulate the cooling of the first and second cooling unit. To this end the heat extraction unit may be configured to allow each inserted cooling unit to be controlled separately in terms of heat extraction rate or temperature. The holder may be provided with transceiver for allowing a communication with a communication system of an inserted cooling unit.

Preferably, the heat extraction rate and/or temperature of each inserted cooling unit is regulated based on measurements of an external or internal temperature of each inserted cooling unit. To this end the cooling units may communicate their temperature to the holder. Moreover, it is conceivable that the cooling units communicate the temperature of the coolant, or the internal temperature of the electronics placed inside the heating channel, or a temperature of the heating or cooling wall. However, the skilled person will realize that any temperature may be suitable to this end, as long as said temperature can be measured by the cooling unit, or by the electronics inside the cooling unit and subsequently communicated to the holder, which can actively and separately adjust the cooling rates of the cooling units inserted. Other characteristics that may be communicated by the cooling unit to the holder may for example be internal pressure, level of flow, temperature, angle and/or amount of incidence of light, tilt or angle of the cooling unit, or vibrations. Based on these values the holder may decide the optimum cooling settings for each individual cooling unit.

In a preferred further embodiment the heat extracting unit is in particular formed by cold plates, peltier effect cooling. It is furthermore possible to use any surface cooling techniques such as forced air cooling using heat sinks if the surrounding of the cooling unit would allow such a technique. That is, if the surrounding is sufficiently cold to provide sufficient cooling. It has turned out that these ways of cooling the holder walls are efficient and provides sufficient cooling.

In yet a preferred and further embodiment the cooling unit further comprises at least one connector, wherein the at least one connector is connected to the printed circuit board by at least one wire, for electronically connecting at last one printed circuit board to another device. This allows the cooling units to be electrically connected, as such a modular system of cooled, connected electronics can be formed. This allows the cooling unit to communicate characteristics to the holder, for preferably regulating the cooling of said cooling unit based on the communicated characteristics. Such characteristics may for example be internal pressure, level of flow, temperature, angle and/or amount of incidence of light, tilt or angle of the cooling unit, or vibrations. Moreover, these characteristics may be unique for each of the inserted cooling units in the holder spaces. Preferably, the at least one connector is positioned on a side of the cooling channel wall and/or heating channel wall facing away from the coolant. This prevents the contamination and possible contact of the connector with the coolant. Preferably the connector is placed on the top and/or bottom of the cooling unit. Placing the connector on the bottom allows for an easy coupling when sliding the connector in the holder.

Preferably, the holder comprises a holding connector, wherein the holding connector is positioned to receive the connector of an inserted cooling unit, forming an electronic connection between the one or more printed circuit boards and the holder. The holding connector and the cooling unit connector are preferably of the opposite type, such that they can mutually couple. To this end the holder connector is preferably placed on the holder bottom, facing toward the holding space such that, a cooling unit connector facing away from the start of the heating channel is coupled to the holder connecter upon fully inserting it in the holder space. In a different preferred embodiment the cooling unit connecter is provided at the top cover of the housing, preferably facing toward the channels, and wherein the holder connector is placed on the holder wall, facing away from the holder space, such that the connectors are coupled upon complete insertion of the cooling unit in the holder space. It is furthermore preferred to provide a plurality of holder connectors and cooling unit connectors, each for providing a different connection. Such connection could as non-limitative example be power connectors or signal connectors.

In a preferred embodiment the holder, preferably the holding space, further comprises a guide, for guiding the housing into the holding space. The cooling units could be either solidly connected to the guide or be removably connected to the guide. The guide allows the cooling units to be inserted correctly, such that preferably the connectors are positioned directly above one another for establishing a connection. Preferably, the guide is formed by a gas spring or actuator, wherein said gas spring or actuator are at least movable in a direction parallel to the holding wall.

In an alternative embodiment, the at least a portion of the cooling channel wall formed by a heat conducting material, allowing an exchange of heat between a part of the coolant in contact with an interior side of said cooling channel wall portion and a surrounding in contact with an exterior side of said cooling channel wall portion, is a heat exchanger, positioned in the cooling channel. Such heat exchanger may be an active heat exchanger, provided with an internal circuit for liquid cooling, and connections or fluid circuitry for circulating such cooling liquid with the exterior side of said cooling channel wall, which may in this case even be to the exterior of the entire immersive cooling unit. It is conceivable that said heat exchanger comprises two or more inlet connectors, and two or more outlet connectors, such that cooling capacity may be adjusted via the amount of connectors that is connected to the cooling circuitry. These embodiments are shown in FIGS. 4 and 5. The fluid connections to, or on, the exterior of the immersive cooling unit preferably connect to co-acting connections of a holder according to the invention. To this end, the holder may be provided with said co-acting fluid connections, for receiving the fluid connections of an immersive cooling unit. As such, the fluid circuitry of the immersive cooling unit may be fluidly connected to the fluid circuitry of the holder. A plurality of immersive cooling units may be fluidly serially and/or parallelly connected to the fluid circuitry of the holder. Moreover, a plurality of holders according to the invention may be fluidly connected serially and/or parallelly to one another. To this end, it may be conceivable that one or more holders are mutually configured for discharging the cooling liquid of the fluid circuitry at a predetermined temperature, in particular the temperature of the cooling liquid at the outlet connection of the immersive unit and/or holder. Preferably said predetermined temperature is suitable for use in a domestic heat network, for heating for example a floor and/or shower water. It is also conceivable that in e.g. a server application, a plurality of said holders provide a significant amount of heat at their outlet connections, such that said mutually connected holders may provide heat for a district heating system. Hence, said holders may be configured for use in a district heating system. It is conceivable that one or more holders are connected to a centralized cooling system, and thereto connected to a central cold cooling liquid circuit, for providing cold cooling liquid to the holders, and the immersive cooling units connected to a holder, and a central hot liquid circuit, for discharging hot cooling liquid from the holders, and the immersive cooling units connected to a holder. Such cooling liquid may be water, glycol, or coolant. Preferably, one or more valves are positioned in the circuitry or central cold or hot circuit, to control the flow of cooling liquid. Preferably, the flow in each of the holders may be separately controllable. This allows the output temperature to be controlled, to reach a desired output cooling liquid temperature. Hence, the device may be controlled such that the heat shed by the electronic components is extracted to an extent that the coolant liquid output temperature is suitable for use in different purposes, such as district heating. Preferably, the extraction of heat from the electronic components via the immersive liquid is controlled such that an output temperature of the liquid coolant is within a predetermined range. Preferably a temperature between 45 and 80 degrees Celsius of the cooling liquid is obtained. Between 45 and 80 degrees Celsius is to be understood as any number in this range. Hence the device may as such be controlled for providing heat to different systems, and the cooling circuitry of said device may be coupled to one or more different systems which may require heat as an input, e.g. district heating. This control allows for cooling of the components and re-using the extracted heat efficiently simultaneously. As such, said heat may be utilized elsewhere. In general, preferably at least one holder is provided with displacement elements, such as wheels, preferably rotatable or swivable wheels. As such, the holders may be easily moved. Hence, the holders may be placed or moved in a central location, where heat needs to be extracted from e.g. batteries, or datacenter equipment, and the extracted heat may be reused directly at said location, or may be transported elsewhere. By using the displaceable holders, the heat may be effectively reused at the location of interest, reducing the loss of heat. It is further conceivable that one or more holders form a rack, said rack configured for receiving a plurality of immersive cooling units, in the one or more holders. At least one, preferably each of the immersive cooling units may be connected to the rack, such as in holder spaces of the one or more holders. Preferably, the immersive cooling units are fluidly connected to a central cooling circuit of the rack and/or holder. As such, the cooling circuitry of the immersive cooling unit is fluidly connected to the centralized cooling circuit of the rack, or holder which allows for more flexibility. Preferably drip-stop connectors are used to mutually fluidly connect immersive cooling units with the holder. In an embodiment, co-acting liquid connectors are provided on an exterior side of the rear or front of the immersive cooling units, and on a respective interior side of the rear or front of a holder. These liquid connectors allow to circulate the liquid coolant and to extract heat from the system. This allows to make the cooling more efficient, but also to make use of the extracted heat. The connectors for fluidly connecting an immersive cooling unit to a holder may be provided in combination with any of the embodiments described in the application. It is also conceivable that the connectors on the exterior side of the holder and/or the immersive cooling unit connect to a fluid hose, which transports cold cooling liquid to the immersive unit or holder, and transports the heated cooling liquid away from the holder or cooling unit. The heated cooling liquid may be transported via the fluid hose to an external location where the heat is extracted from said cooling liquid, and there optionally reused, and the cooled cooling liquid is transported back to the holder or cooling unit. It is however also conceivable that the holder or immersive cooling unit is connected to a cold cooling liquid supply hose, and a hot cooling liquid discharge hose, wherein the cooling circuit is not a closed cooling circuit. The heat may also be extracted externally, via an external system (i.e. not by means of a heat exchanger inside the immersive cooling units). Preferably, said liquid connectors are blind mating connectors, such that the connectors are self-guiding, providing for an easy coupling of the immersive cooling unit with a holder. It is also conceivable that a holder as such may be provided on an exterior side, preferably a rear exterior side, with blind mating connectors for fluidly connecting said holder to a liquid supply and/or drain connector of another system. Such a system may for example be a ship, or a mobile studio. In such instances said blind mating connectors may be of additional benefit, since the holder may only be accessible from a front side, which does not allow for tightening a connector on a rear side. It is important to note that in this respect there are two different cooling liquids. One being the immersive liquid inside the immersive cooling unit, the other being the cooling liquid used in the cooling circuitry, which cooling circuitry may include the aforementioned heat exchanger through which said cooling liquid flows. It is also conceivable that the liquid connectors are provided on an exterior side of the front of the immersive cooling units, and on a respective interior side of the front of a holder. These liquid connectors allow to circulate the liquid coolant and to extract heat from the system. This may in particular be beneficial in when the holder is located in a hard to reach environment, such as studios, or OB-vans, ships, or airplane transport. This configuration may allow the holder to be tightly located in a corner of a space, or abutted against a wall, whilst keeping the fluid connections in the front accessible. In particular it is beneficial if liquid connectors are provided on an exterior side of the holder, which are fluidly connected to the liquid coolant system of the immersive cooling unit inserted and to the holder. As such, external systems may be easily coupled to the holder. This allows a more diverse application of the holder and immersive cooling unit.

Preferably, the cooling capacity of the immersive cooling unit and the cooling capacity of a holder is modularly adjustable. In an embodiment according to the invention a plurality of co-acting liquid connectors are provided on an exterior side of the immersive cooling unit, and on a respective interior side of the holder. For example two liquid inlet and two liquid outlet connectors on the exterior of the immersive cooling unit, and two liquid inlet and two liquid outlet connectors on an interior side of the holder, wherein said connectors are in particular co-acting, for allowing a liquid connection between said inlet and outlet connectors. The cooling capacity is as such modular since the amount of connectors that is utilized determine the capacity. Hence, when more fluid connectors are mutually fluidly connected a bigger coolant flow may be established, and hence a bigger cooling capacity may be achieved, without the need for expensive regulating pumps. This embodiment is in particular beneficial in case the plurality of liquid inlet connectors and liquid outlet connectors are each connected to two different heat exchangers deposited inside the at least one closed heating channel. It is however also conceivable the plurality of liquid inlet connectors and liquid outlet connectors are each connected to a single heat exchanger inside the at least one closed heating channel, said heat exchanger comprising two or more inlet and two or more outlet connections, connected or connectable to the connectors of the immersive cooling unit and the holder. As such, the cooling capacity may be scaled by connecting a further connection to the cooling circuit of the holder.

In a further embodiment the holder according to the present invention may be arranged to allow for selective power distribution over multiple inserted immersive cooling units. In particular this may be beneficial in case batteries are deposited in the immersive liquid. As such the present invention may allow for flattening power peaks over time, to prevent peaks from overloading the network. Flattening the power consumption peaks over time may be arranged as described within NL2021/050690, which is herewith incorporated by reference. In for example an Alternating Current system, one grid having three phases may be connected via an AC distributer, to a plurality of holders, each having one or more immersive cooling units connected thereto. Optionally, a redundancy setup, being a second grid with multiple phases, may be connected to the same AC distributer. Power from each of the separate phases may arbitrarily be connected to individual immersive cooling units provided in the plurality of holders. One immersive cooling unit of a first holder may be connected to the first phase, the second and third immersive cooling unit thereof connected to a second phase of the grid, and a further second holder having three immersive cooling units may be connected entirely to the last phase. It is also conceivable that each holder is connected to a single phase. Any connection between a phase and one or more immersive cooling units connected to a holder may be established. The balancing of power peaks may be established by conveniently allocating specific immersive cooling units of holders to a specific phase, or by allocating a specific phase to a specific holder or immersive unit connected thereto. Said peak power balancing is also conceivable in case of DC power networks. 380-400V DC power may be converted into ATX-standard DC voltages in a DC distributer, which may connect to a plurality of holders connected to the DC distributer. It is also conceivable to provide for a 12V or 24V only bus. In an AC/DC network. The same connections as described with the DC configurations are provided, wherein incoming AC power is first converted into DC voltage via at least one AC/DC converter. The holders or immersive cooling units may be connected, either directly or indirectly, to a common printed circuit board or may each be connected to their own respective printed circuit board, which are mutually connected via an interface, or via wiring. This printed circuit board, which may be referred to as backplane PCB, may be provided with an AC pin, line or neutral, a DC pin, 12V+/12V− or 6V+/6V− or 3.3V+/3.3V−. Preferably also power pins are rated to a maximum power of 60 A.

Preferably, the immersive cooling unit comprises at least one, preferably closed, immersive space, wherein the at least one closed cooling channel and the at least one closed heating channel are at least partially located inside the immersive space, and at least one non-immersive space, separated from said immersive space, and configured for receiving one or more electronic components. In particular the immersive space and the non-immersive space are isolated from one another, or in other words, the non-immersive is essentially free of any liquid coolant. On the other hand, the immersive space, wherein the at least one closed heating and cooling channel are located, is filled with liquid coolant. This allows the electronic components which dissipate great amounts of heat to be located inside the immersive space in order to be cooled by the liquid coolant as described with reference to the closed heating and cooling channel. Components which dissipate a relatively low amount of heat may be located in the non-immersive space. Such non-immersive space components may in particular be (hot) swappable media, such as Input/Output (I/O) devices such as storage media (SSD, HDD and the like), or interface cards such as (OCP) Networking devices, fiberchannel, ethernet, and the like. It is preferred that the at least one non-immersive space is easily accessible. This allows the electronic components therein to be easily replaced. The cooling unit as such may thus be seen as a cassette comprising an immersive and non-immersive space. Preferably, the entire cassette is configured for co-acting with a holder according to the invention.

Preferably the non-immersive space is provided with one or more connectors, configured to co-act with electronic components for electrically connecting one or more electronic components, via the one or more connectors, to a printed circuit board in the immersive space. It is also conceivable that the non-immersive space is provided with a common printed circuit board, comprising a plurality of connectors, wherein the common printed circuit board is electronically connected or connectable to a printed circuit board in the immersive space. This allows the electronic components that are placed, or in particular connected to a connector or printed circuit board, in the non-immersive space to be electrically connected to the immersive space. The connector and/or common printed circuit of the non-immersive space may be electrically connected to the immersive space via at least one connector cable, such as a PCIe 3.0+ cable, or via SATA, SAS, SFF-8643 cables. The present invention is however not limited to these types of cables, and any type of cable suitable for connecting an I/O storage to another device should fall within the scope of the present invention.

In a preferred embodiment the immersive cooling unit comprises a common housing, wherein the immersive and non-immersive space are defined by the common housing. It is however also conceivable that the non-immersive space may be provided onto the common housing of the immersive cooling unit, e.g. by means of glue, bolts, or other fastening means. Preferably, a part of the common housing defines the immersive space, wherein preferably, at least a part of the circumferential heating channel wall and/or circumferential cooling channel wall form at least a part of the part of the common housing that defines the immersive space. The immersive space is preferably a closed space, such as to comprise a bottom wall, side walls, and a top wall. Preferably, the common housing also defines the non-immersive space, wherein the non-immersive space comprises at least one open side, though which open side the non-immersive space is accessible. It is conceivable that a lid is provided on the non-immersive space, to prevent dust from collecting on the common printed circuit board in the non-immersive space. Optionally, a fan may be provided to cool components inside the non-immersive space. A fan, or the like, would be sufficient in this respect since the electronic components placed in the non-immersive space are typically of the type that do not dissipate a lot of heat. An additional advantage of providing for a non-immersive space is that the electronic components (such as SDD, HDD, OCP NIC, Ethernet, etc. are more prone to fail, or to become outdated. Since they are in the non-immersive space, which is easily accessible, one can easily replace said electronic components, without interfering with the immersive space. Hence, electronic components in the non-immersive space may be replaced without interfering with the immersive space, and hence whilst the immersive space is in operation.

Moreover, it is highly conceivable that the non-immersive space according to the above description may be applied separately from the other features. Hence the present invention is furthermore related to an immersive cooling device comprising at least one non-immersive space. Said non-immersive space may for example be embodied according to any of the above-described embodiments. By means of said non-immersive space it may be conceivable to provide for an immersive cooling device having more flexibility and less downtime. This may be achieved by the application of the non-immersive space since various components, preferably (hot) swappable components, may as such be more easily be replaced, essentially without interfering with the immersive cooling liquid. Such swappable components may for example be hard disks, flash storage, (network-) interface cards, and the like. It is beneficial to replace said components without having to access the immersive space since this would often require the device to be shut down entirely causing more undesired downtime. Moreover, since these components generally have a lower cycle time compared to the components inside the immersive cooling liquid, it is also beneficial from a maintenance point of view to have them easily accessible from outside the immersive space. Non-immersive space may be understood as a part of the device comprising at least one, preferably a plurality of slots and/or connectors. Said slots and/or connectors being configured for receiving at least one electronic component, such as hard disks, flash storage, (network-) interface cards. Said non-immersive space may be provided on either the front, the rear, or the sides of the immersive cooling device. Preferably, said non-immersive space is disposed on an accessible side of the immersive cooling device, in particular accessible during operation. Although it is preferred that the non-immersive space is at least partially inside, or composed out of, a part of the housing of the immersive cooling device, it is conceivable that the non-immersive space may be defined by a printed circuit board provided on an exterior surface of the immersive device. Preferably wherein said exterior surface of the immersive device is not in direct contact with immersive cooling liquid. Hence, said non-immersive space may also be provided for on open-top immersive devices, such as those used in server rooms, wherein the non-immersive space is provided for on an exterior wall thereof. The non-immersive space may be an add-on component or structure. Preferably, said add-on is configured to be electrically connected to electronic components submerged in immersive cooling liquid. To this end, a printed circuit board or connectors may be used. Said printed circuit board or connectors may electrically connect the one or more submerged electronic components with the one or more swappable components. In particular, the printed circuit board is connected electrically directly or indirectly to the submerged components, and wherein the printed circuit board is provided with one or more connectors for receiving the swappable components. The electronic components deposited inside the immersive cooling liquid are connected via one or more cables to the printed circuit board of the non-immersive space. Said cables are rated to withstand temperatures and conditions inside the immersive cooling liquid. Said cables extend through the wall of the immersive space to be connected to the printed circuit board of the non-immersive space in a fluid-tight manner. The electronic connection between components submerged in the immersive cooling liquid and the components in the non-immersive space may comprise a communication bus. The printed circuit board in the non-immersive space may be provided with one or more types of connectors, such as SATA, SAS, PCI-bus, Comm-bus, CAN, and the like. Said printed circuit board is configured for mutually connecting a plurality of electronic components, or printed circuit boards, which may either in the immersive space, or in the non-immersive space. It is also conceivable that the non-immersive space is provided with a plurality of printed circuit boards, each being electrically connected to one or more electronic components in the immersive cooling liquid. A non-immersive space may alternatively be applied to an open-top immersive cooling unit, wherein the non-immersive space may be attached to an exterior side of the immersive space.

The present invention is further related to a holder, in particular a holder according to the invention, for use in an immersive cooling system, said holder comprising at least one holding space formed by at least a holding bottom and at least one circumferential holding wall, wherein the at least one holding wall is dimensioned to receive a cooling unit, wherein a part of the holding wall facing toward the holding space is thermally connected to at least the exterior side of the cooling channel wall of an inserted cooling unit, a least one heat extracting unit, for actively extracting heat from the part of the holding wall that is thermally connected to the exterior side of the cooling channel wall of an inserted cooling unit. The benefits described in relation to the immersive cooling unit according to the invention apply also to the holder according to the invention and are hereby incorporated by reference with respect thereto. It is conceivable that the holder comprises a common holder housing, wherein said common holder housing at least partially defines the at least one holding space. It is furthermore conceivable that said at least one common holder housing defines at least one non-immersive holder space, wherein said non-immersive holder space is configured for receiving one or more electronic components.

Preferably the non-immersive holder space is provided with one or more connectors, configured to co-act with electronic components for electrically connecting one or more electronic components, via the one or more connectors, to a printed circuit board in the immersive space of an inserted cooling unit. It is also conceivable that the non-immersive space is provided with a common printed circuit board, comprising a plurality of connectors, wherein the common printed circuit board is electronically connected or connectable to a printed circuit board in the immersive space of an inserted cooling unit.

The present invention is further related to a method of using an immersive cooling unit according to any of the preceding claims, for actively cooling electronic components. The same benefits as elucidated above with respect to the cooling unit are applicable to the method according to the invention.

The present invention is further related to an immersive cooling unit, wherein the at least one heating channel is accommodating at least one heat dissipating electronic component, preferably one or more batteries, or battery packages, instead of a printed circuit board comprising heat dissipating components thereon. This inventive concept may also be applied independently of the printed circuit board application, optionally in combination with one or more of the embodiments described in this application. The immersive cooling unit may be adapted in custom or standardized sized containers to allow for an arbitrary number of batteries or battery cells. The holder may be adapted to receive an arbitrary number of immersive cooling units, depending on the requirements of the specific application. The presence of battery cells or a battery instead of the printed circuit board with electronic components may also be applied in combination with any embodiment, replacing the printed circuit board and electronic components. The immersive cooling unit may thus comprise a plurality of battery cells, and preferably a battery management system, inside the closed heating channel. It is also conceivable that the battery management system is provided elsewhere on or in the immersive cooling unit. This may be according to any of the embodiments described in this application, and also provide for similar benefits as described. In this configuration, the batteries or battery packages in the immersive cooling unit typically generate heat, in particular they generate heat when components that are being charged by said batteries demand a high power, such as when charging an All-electric Vehicle (EV), such as a motor, car, airplane, or other electric vehicle. The immersive cooling unit may be provided in a holder according to the invention. When more than one immersive cooling unit having one or more batteries is connected to the holder, it is conceivable that the one or more battery cells in each of the immersive cooling units are electrically mutually connected, in series or in parallel. This may be achieved via electric connectors or via wires. Preferably, the immersive cooling unit and the holder are provided with co-acting connectors. Preferably for connecting the heat exchanger internal circuitry with a cooling circuitry of the holder, as described in this application, preferably said connectors are dripless and blind mating, to allow for an easy coupling without spilling liquid. Additionally, electric connectors may be provided, to connect the one or more battery cells of an inserted immersive cooling unit to the electronic circuit of the holder. The batteries may for example be charged via green energy sources, such as solar panels, wind turbines and the like. As such, the immersive cooling unit may also act as an energy storage unit. Preferably, at least one power output connector is provided on the holder, for providing electric power from the one or more battery cells of the inserted cooling units (hence discharging the battery cells inside the immersive cooling units). Preferably, at least one power input connected is provided on the holder, for providing electric power to the one or more battery cells of the inserted cooling units (hence charging the battery cells). When the batteries or battery cells are sufficiently charged, they may be used to charge an EV connected to the batteries via an electronic connection. Typically, in particular when fast charging an EV, batteries dissipate a significant amount of heat. The batteries are cooled by the immersive cooling liquid, which heats up as a consequence, wherein the immersive cooling unit and holder may be configured for transferring the heat from the batteries to different systems. This may be achieved in particular by a heat exchanger inside the cooling channel, which cools the immersive cooling liquid, and heats up a cooling liquid which flows through said heat exchanger, as described in the application. Such different systems may for example be a boiler, which may be connected directly or indirectly to the immersive cooling unit or holder via a heat exchanger. As such, heat shed by the batteries heats the immersive cooling liquid. Subsequently, the immersive cooling liquid is cooled, either via cold plates, or a heat exchanger placed in the closed cooling channel (or another embodiment described within the application). Water from a boiler system, which is yet to be heated, may pass through the heat exchanger inside the cooling channel of the immersive cooling unit, as a consequence cooling the immersive cooling liquid. The heated water may be used for bathing, or heating floors, or showering for example. It is conceivable that charging the EV may be timed such that fast charging is planned during a shower, in order to provide for the most efficient reuse of heat. To this end a controller may be configured to receive parameters such as water usage, in order to determine when a shower is turned on and activate the fast charging to reuse the most amount of heat shed by the batteries. To this end, said controller may be configured for activating and/or deactivating charging of the EV. Where EV is described as an example, any alternative which requires similar amounts of current/voltage level may be applied in this respect. This application, wherein use is made of the heat generated when charging a battery or battery cells by the immersive cooling unit according to the invention for heating domestic systems may also be applied independently, optionally in combination with one or more of the embodiments described in this application. Where in this application a holder is mentioned, this may also be referred to as a chassis. Where in this application an immersive cooling unit is mentioned, this may also be referred to as cassette or the like. This is of no impact on the scope of protection.

A further possible application is for providing more efficient water electrolysis. The aforementioned holder with one or more immersive cooling units connected thereto, each immersive unit having one or more heat dissipating components arranged inside the immersive cooling units heating channel, such as battery cells, wherein said batteries or cells may be charged by means of renewable energy sources, such as wind or solar energy to charge the battery cells. Said battery cells are preferably used for providing energy to an electrolysis process. The holder may be connected to a boiler or insulated water tank. Cold water may be fed to the holder, wherein said cold water is used to absorb the heat generated by the batteries or cells inside the holder or immersive cooling unit, preferably by feeding the cold water through a heat exchanger inside the immersive cooling unit. The discharge temperature of the cooling water from said holder is typically within the range of 50 to 80 degrees Celsius, in particular above 60 degrees Celsius. The heated water may be stored in the boiler or insulated water tank, where required the water in the tank may be further heated to a predetermined temperature, such as between 90 and 120 degrees Celsius, in particular 100 degrees Celsius. Such temperature may be achieved by using a heat pump. Typically, the holder is electrically connected to the electrolysis process, for providing the required power for establishing the electrolysis process for generating hydrogen fuel. Since the required energy is predictable, a relatively constant energy from the battery cells in the immersive cooling unit is drawn, which makes it possible to control the flow of cold input water, such that the discharge temperature of the cooling liquid of above 60 degrees may be realized continuously. The hot water tank or boiler may also or alternatively be fed with hot water from a data center which datacenter may be equipped with immersive cooling units according to the present invention for cooling datacenter equipment. The hot water may be used in a water electrolysis process. Hence the present invention is thereto configured for providing hot water and/or electricity to a water electrolysis process, either directly or via a water tank or boiler. As such, the immersive cooling unit having one or more batteries together with a holder provided with one or more of said immersive cooling units may be used as temporary energy storage. The energy from the batteries constantly added in the process of electrolysis. This may result in more effective use of variable energy sources such as wind, tidal and solar energy. the chassis or holder may in this, or any other embodiment, be fitted with a power distribution system with optional load balancing per phase (AC) or redundancy. This application, wherein the hot water of an immersive cooling unit according to the invention may also be applied independently, optionally in combination with one or more of the embodiments described in this application.

The holder provided with one or more immersive cooling units may be configured for heating a hospital bed. Hospital beds may be heated by means of a heating liquid, increasing the comfort of a patient laying in said heated bed. Normally, this requires water to be heated by through a boiler or the like. The present invention thereto proposes an improved solution, wherein heat is provided from a more renewable source, making use of necessary equipment for providing the required heat. To this end, it is conceivable that the electronic components arranged inside the immersive cooling unit, in particular in the heating channel thereof are in particular medical equipment or monitoring equipment. This equipment is turned on for long periods of time, and dissipate a consistent amount of heat, which equipment may require cooling to prevent overheating. By depositing said medical and/or monitoring equipment in the immersive cooling unit, the heat dissipated by said equipment may be reused according to the embodiments described in this application, for heating the hospital beds. To this end it may be of benefit to provide for a transportable holder according to a specific embodiment of the invention, such that the holder may be transported close to the hospital bed to make optimum use of the heat. An additional benefit of this specific use of the invention is that the equipment is normally cooled by means of forced convection, i.e. by a fan which forces air through or over the heat generating equipment. As such, the present invention essentially eliminates noise generated by conventional equipment. Also, by using the immersive cooling technique, the hospital beds may be heated in a more silent way since the residual heat may be reused. This may be achieved since the immersive cooling liquid is silent, also no pump is required due to the use of the natural convective flow induced by the heat dissipated to the immersive cooling liquid, hence providing for a no-noise cooling and heating of the beds. As such, the noise in a hospital room having a plurality of said beds may be reduced significantly or completely, which is more comfortable for the patients. An even further benefit of using the present invention for this purpose is the better containment of the medical or monitoring equipment, especially since the equipment is deposited inside the immersive cooling units, no unintended liquid is accidentally spilled thereon. Even further, by delimiting the need for forced convective cooling by means of fans, less energy is required. And since heat is extracted from the medical or monitoring equipment, a separate boiler that is normally used for heating the hospital bed is redundant. It is conceivable that the present invention for cooling hospital equipment may be applied independently, optionally in combination with one or more of the embodiments described in this application.

Yet in an alternative embodiment, the present invention may be used for more efficient heat supply for district heating. To this end, at least one holder provided with at least one immersive cooling unit may be connected to an air-conditioning system. In particular the cooling fluid inlet connection of the holder may be connected to the outlet connection of the air-conditioning system. The coolant outlet of the air-conditioning is typically in the range of 25 to 30 degrees Celsius. The coolant may enter the holder and/or immersive cooling unit via the coolant inlet connector thereof. By cooling the batteries or electronic components arranged in the heating channel of the immersive cooling unit the temperature of the coolant raises. If a controller or controllable pump is provided, the coolant circuitry may be configured to control the flow of coolant such that an outlet temperature of the coolant is suitable for use in a district heating system, preferably, the outlet coolant of the holder is in the range between 55 and 65 degrees Celsius. Hence, this allows to reuse heat from buildings such as homes and/or offices to resupply heat to the system, allowing more buildings to be connected to a single district heating system due to the more efficient use of heat.

The present invention will hereinafter be further elucidated based on the following drawings, wherein:

FIG. 1 schematically shows a first embodiment of the cooling unit,

FIG. 2 schematically shows a second embodiment of the cooling unit;

FIG. 3 schematically shows a cooling unit inserted in a holder;

Figure 1:
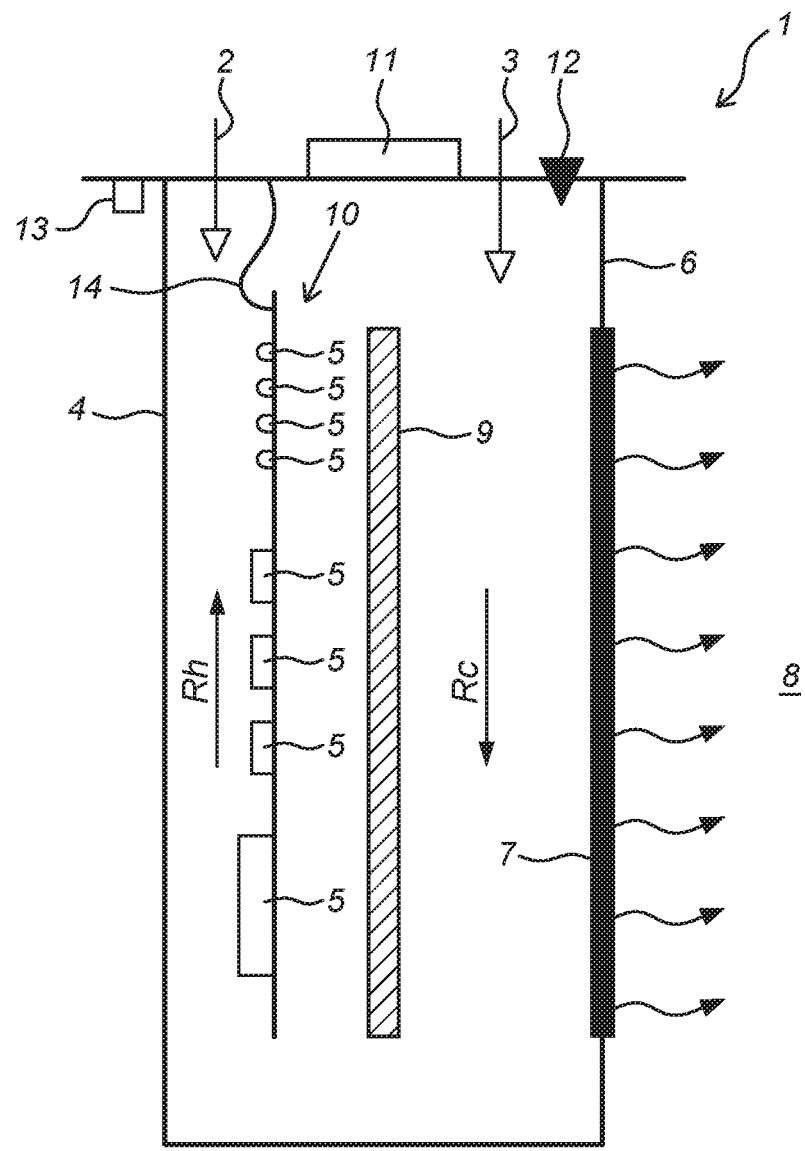

In FIG. 1 a first embodiment of the immersive cooling unit 1 is shown in a side view. The cooling unit 1 comprises a closed heating channel 2 and a closed cooling channel 3, wherein a start of the heating channel 2 is connected to the end of the cooling channel 3, and the start of the cooling channel 3 is connected to the end of the heating channel 2.

As such, a closed circuit is formed between said channels 2, 3. The circumferential wall of the heating channel is formed by an insulating wall 9, and a portion of a common housing 4. The circumferential wall of the cooling channel 3 is formed partially by the same insulating wall 9, and a different portion 6 of the common housing. Inside the heating channel 2 a printed circuit board 10 is provided. Although only one is shown in this figure, in fact a plurality of them can be accommodated in the heating channel 2. On the printed circuit board 10 heat dissipating electronic components 5 are positioned. These components 5, such as processors, MOSFETs, capacitors, and the like, are at least in thermal contact with a liquid coolant. The liquid coolant preferably entirely fills the closed circuit. The coolant absorbs the heat generated by the electronic components 5. As the coolant in the heating channel increases in temperature, a convective flow with at least a vertical component Rh is initiated. Once the coolant is displaced from the heating channel 2 to the cooling channel 3, through the connection between the end of the heating channel 2 and the start of the cooling channel 3, the coolant is cooled. By cooling the coolant in the cooling channel 3, a flow with at least a vertical component Rc, typically opposite to the aforementioned component Rh, is created. The coolant inside the cooling channel 3 is cooled by a portion of the circumferential cooling channel wall 6. In particular a portion 7 of this wall is formed by a conductive material. This material allows an exchange of heat between coolant present in the cooling channel 3, in particular the coolant that is in contact with said portion 7 of the wall 6, and a surrounding 8, in particular the surrounding that is in contact with the exterior part of said portion 7 of the wall 6. By this way a natural convective flow with a vertical directional component Rc is present in the cooling channel 3. Once the coolant has reached the end of the cooling channel 3 it flows to the heating channel 2 where it is heated by the components 5, and hence forced upward again.

Figure 2:
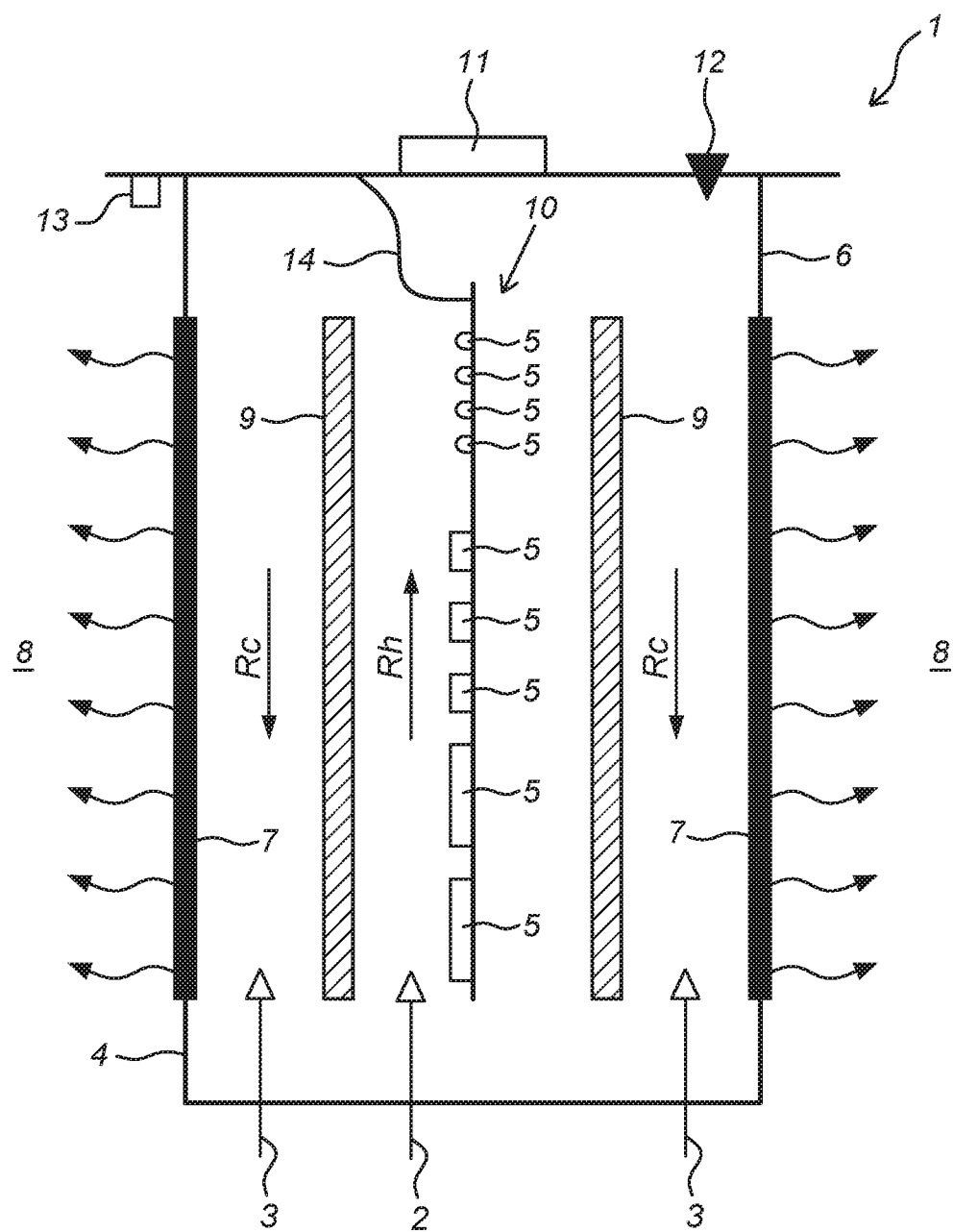

FIG. 2 shows a second embodiment of the cooling unit 1 according to the present invention, also in side view. In this non-limitative embodiment the cooling unit 1 comprises one closed heating channel 2, which is sandwiched between two closed cooling channels 3. The channels 2, 3 are separated by two heat insulating walls 9. Each heat insulating wall 9 forms part of both the circumferential wall of one cooling channel 3 and the circumferential wall of the heating channel 2. The printed circuit board 10 is again accommodated inside the heating channel 2. The heat generating components 5 thereon generate heat which is at least partially absorbed by the coolant, which fills the cooling unit 1. By heating the coolant, a convective flow with at least a vertical component Rh is created. The creation of the convective flow is enhanced by sorting the components 5 on the printed circuit board 10 in a direction from the start of the heating channel 2 to the end of the heating channel 2, from highest power and/or heat dissipation to the lowers power and/or heat dissipation. By placing the components 5 that lose the most heat or have the highest temperature at the start of the heating channel 2 the highest possible temperature difference between coolant and components is achieved, which drives the natural convection.

In both FIGS. 1 and 2 the housing comprises a top cover, which is attached to the housing walls 4, 6 in a fluid tight manner such that the cooling unit 1 can even be held upside down without spilling coolant at least for a short amount of time. The housing further prevents other unwanted liquids such as rain, drinks, or dust from coming into the cooling unit and/or holder. On the top cover a handle 11 is provided such that the cooling unit 1 can be carried easily. The handle 11 can furthermore be used to accurately position the cooling unit 1. A valve 12 is provided on the top cover to provide access to the closed circuit. The valve 12 could furthermore serve as a safety valve to reduce pressure inside the closed circuit, in case an overpressure is reached inside the closed circuit.

Figure 3:
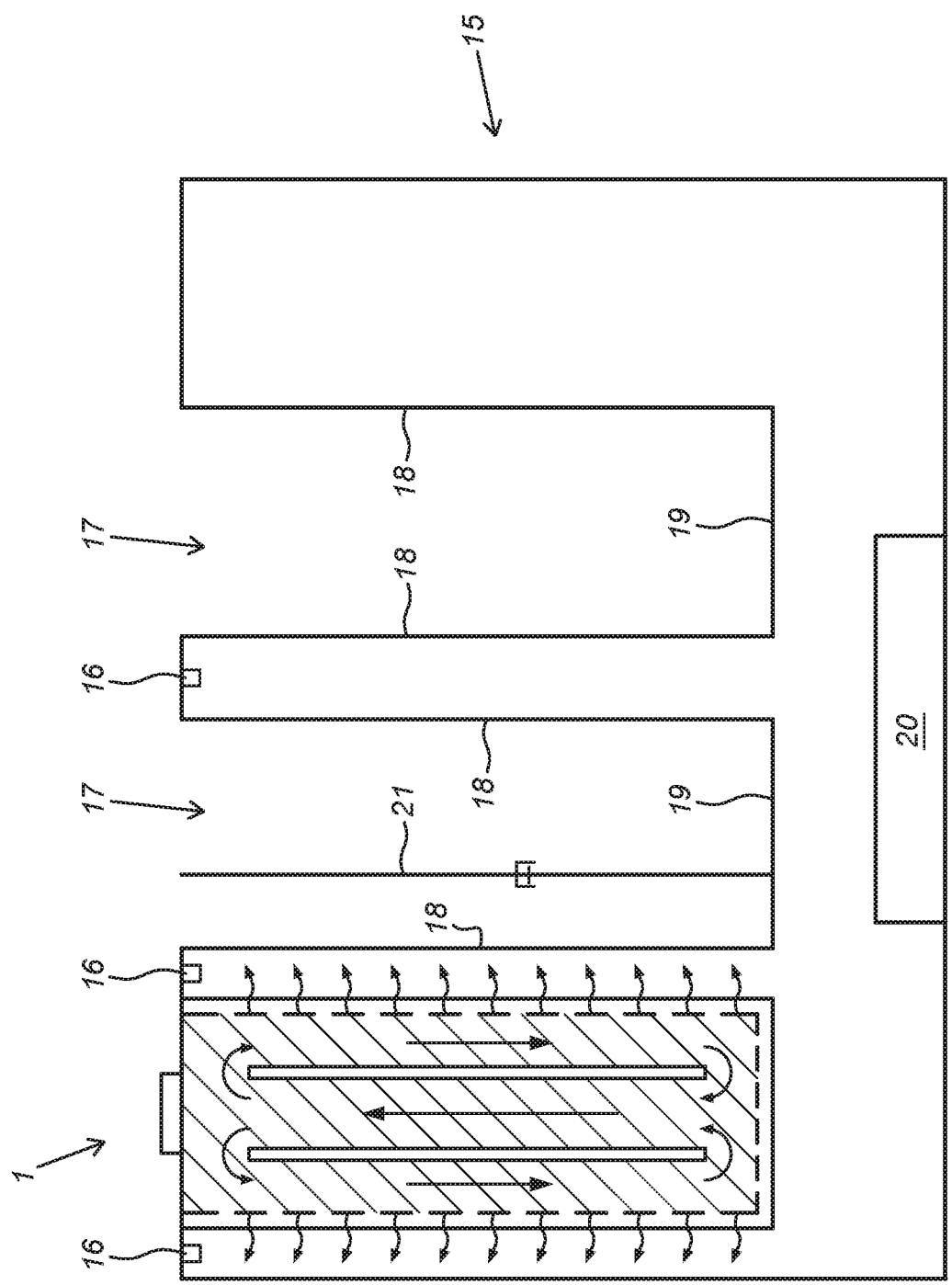

FIG. 3 shows a side view of the holder 15 according to the present invention. This particular embodiment shows the holder comprising a plurality of holding spaces 17, which are drawn up by holder walls 18 and a holder bottom 19. The walls 18 are dimensioned such that they form a holding space 17 which is able to receive a cooling unit 1 according to the invention. Preferably the cooling unit 1 is received tightly, such that an exterior wall surface of a cooling channel circumferential wall, in particular the portion 7 made of conductive material, is thermally connected to the holder wall 18 without intermediate material. This allows the portion 7 of the wall 6 of the cooling unit 7, in particular the cooling channel 3, to exchange heat with the holder 15, in particular the wall 18 of the holder. Preferably the holder walls 18 are cooled down by a central cooling unit 20 such that they extract heat, that is through the portion 7 of the wall 6 of the cooling unit 1, from the coolant. Since the cooling unit tightly fits inside the holding space 17 it is beneficial to install a guide 21 which guides the cooling unit 1 into the holding space 17. This could be a gas spring, or linear actuator. The cooling unit 1 could be rigidly secured to the guide 21 or be detachable. A horizontal top surface of the wall 18 is provided with a connector 16, which is located such as to receive the connector 13 of the cooling unit 1.

Figure 4:
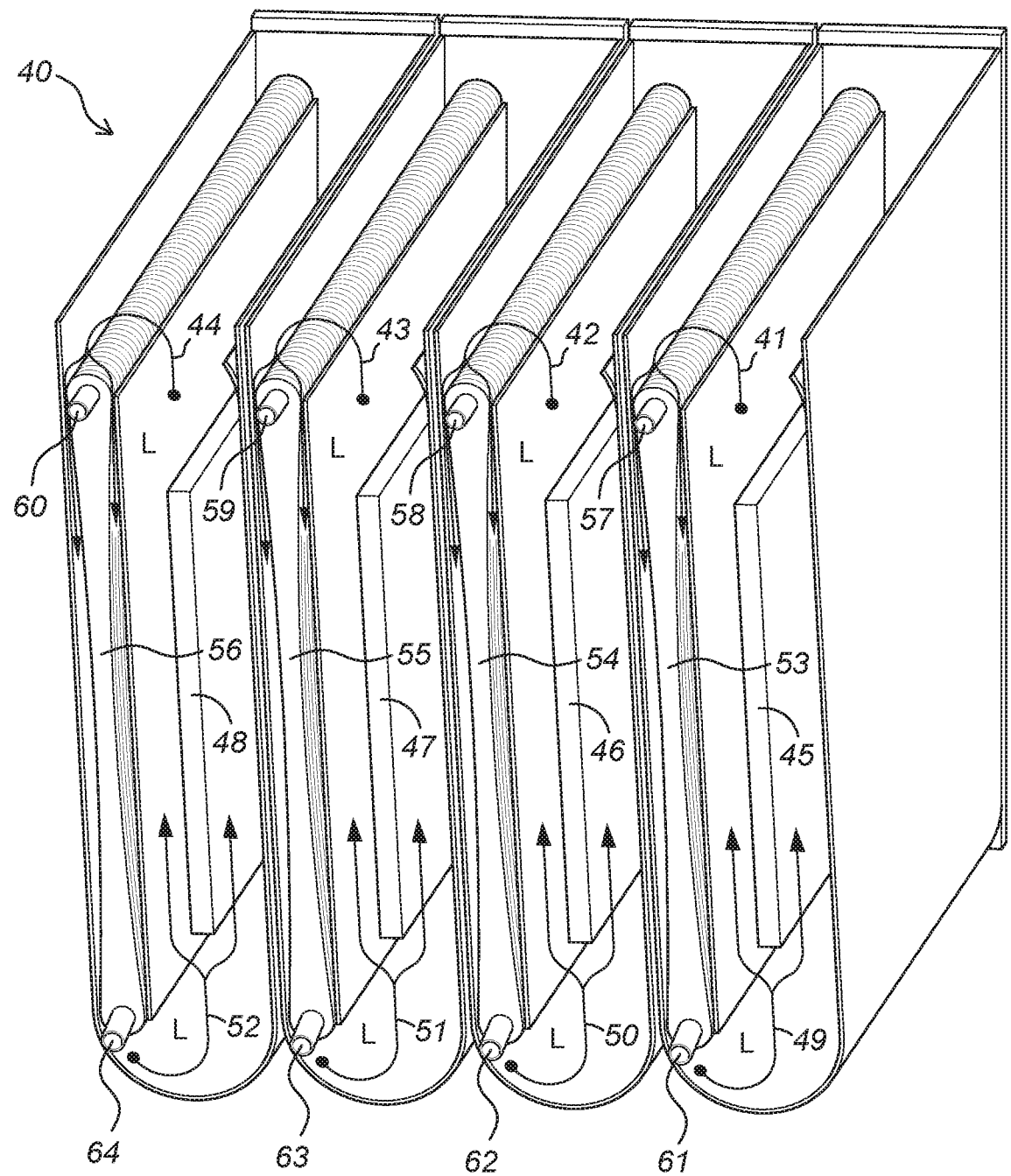
FIG. 4 shows a first view of an alternative embodiment of the present invention.

FIG. 4 shows an embodiment 40 of the present invention, comprising multiple closed heating channels 49-52, each defined by at least one circumferential heating channel wall (of which a top side is defined by a non-depicted wall part or lid), having a start and an end, accommodating printed circuit boards 45-48, wherein one or more heat dissipating electronic components are provided on each printed circuit board, multiple cooling channels 41-44, defined by at least one circumferential cooling channel wall, wherein a start of the cooling channel is connected to an end of the heating channel, and wherein an end of the cooling channel is connected to the start of the heating channel such that a closed circuit is formed between the channels, a liquid coolant L, for cooling the electronic components, said coolant at least filling the channels 41-44, 49-52 and submerging the printed circuit boards 45-48, wherein the channels each allow a coolant flow having at least a vertical component wherein an internal portion of the cooling channel walls is formed by a heat conducting material, in particular a heat exchanger 53-56, said portion allowing an exchange of heat between a part of the coolant in contact with an interior side of said cooling channel wall portion and a surrounding of an exterior side of said cooling channel wall portion, more in particular a surrounding of the immersive cooling device 40. For that purpose, external connections 57-64 are present. Instead of a connection where the heating channels and the cooling channels are alternated, they may be arranged in pairs, such that cooling channels are adjacent to each other and heating channels are adjacent to each other. Heat exchangers shared by two adjacent channels are thinkable too.

Figure 5:
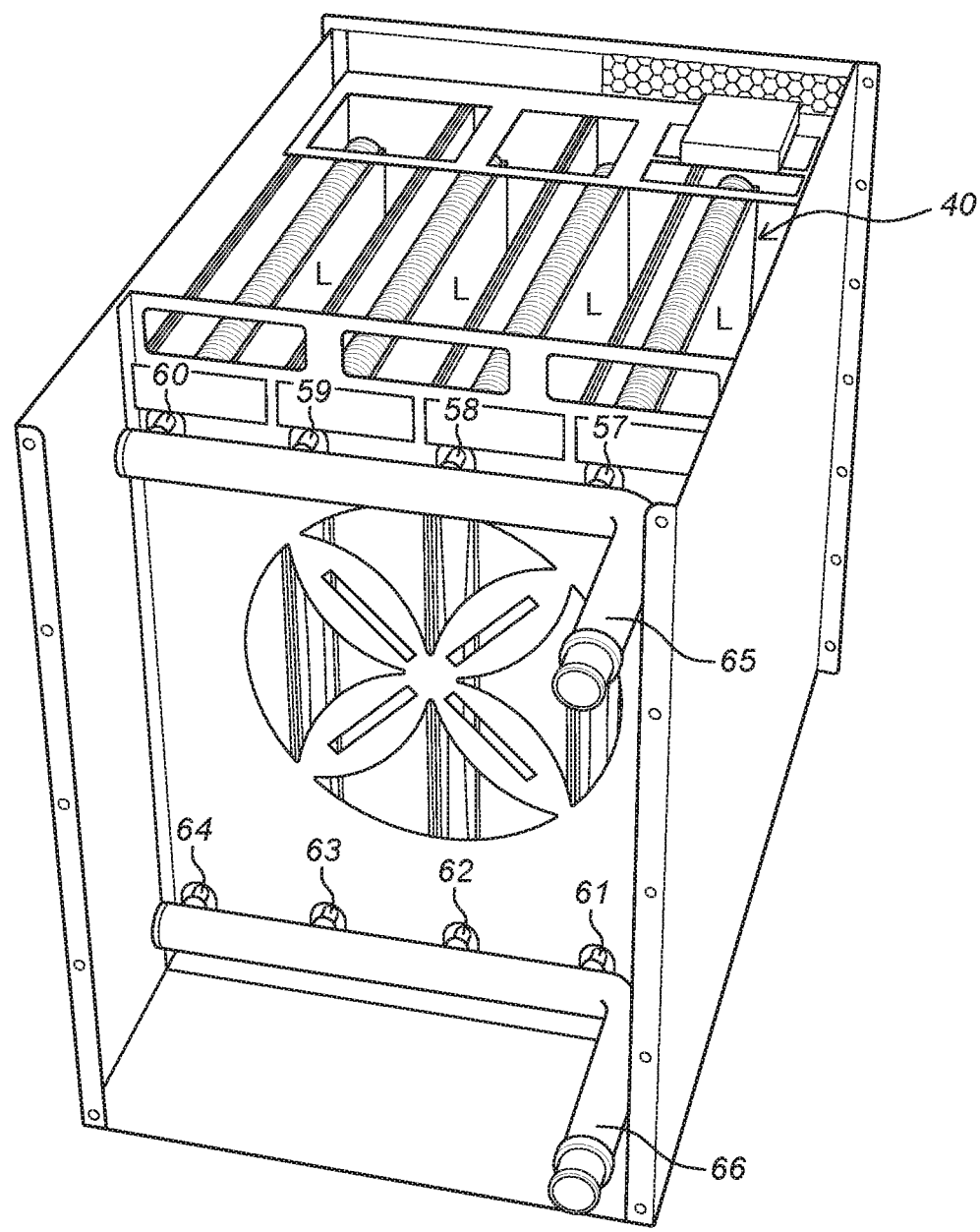
FIG. 5 shows a detail of the embodiment from FIG. 4.

FIG. 5 shows the embodiment 40 from FIG. 4, with a more complete housing. The external connections 57-60 are commonly connected to a cooling fluid input 65, and the external connections 61-64 are commonly connected to a common fluid output 66. Evidently, input 65 and output 66 can be used the other way round. The input 65 and output 66 may be connected to the external connections 57-60 by means of quick release or snap-fittings.

Figure 6:
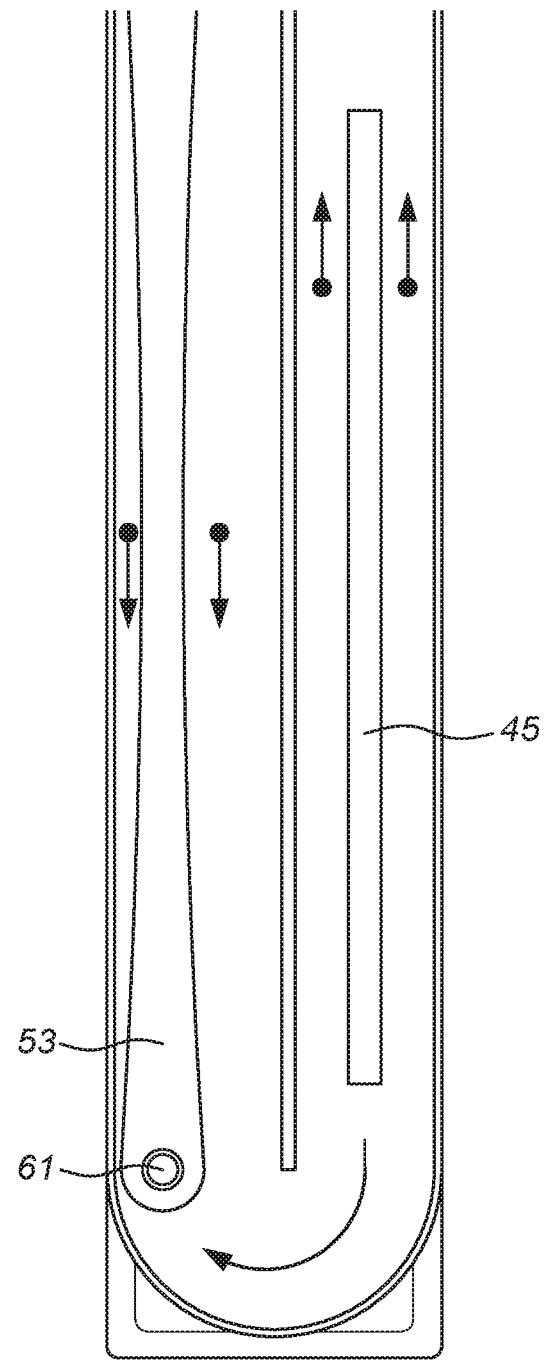
FIG. 6 shows a further detail of the embodiment from FIG. 4.

FIG. 6 shows a further detail of the embodiment 40 from FIGS. 4 and 5. A benefit of this embodiment is that it is even more modular, more robust because the heat exchangers are placed at the interior, and maintenance is easier because the heat exchangers can be coupled and de-coupled from a cooling system.

Figure 7:
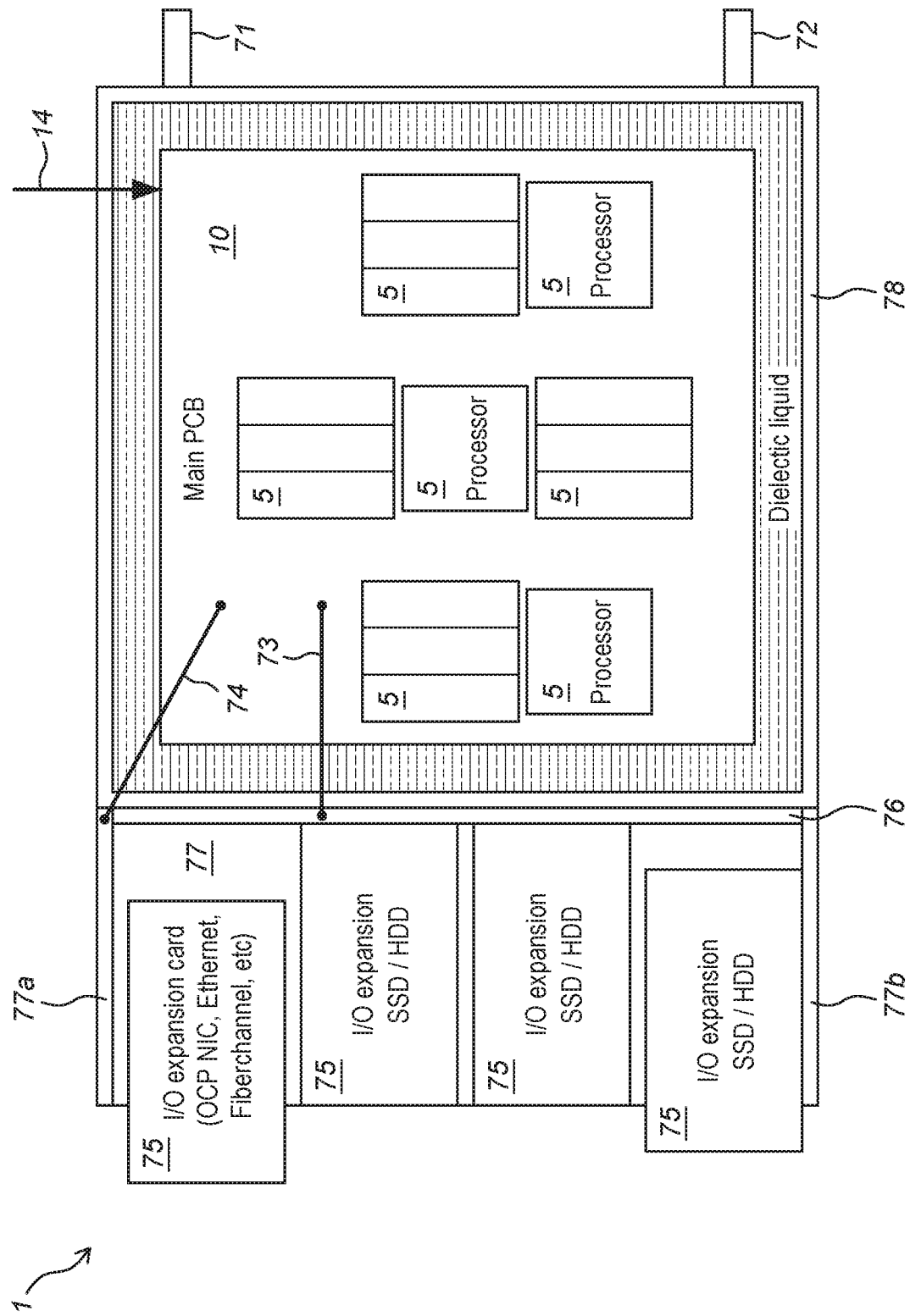
FIG. 7 shows an embodiment of an immersive cooling unit having a non-immersive space according to the invention.
Figure 8:
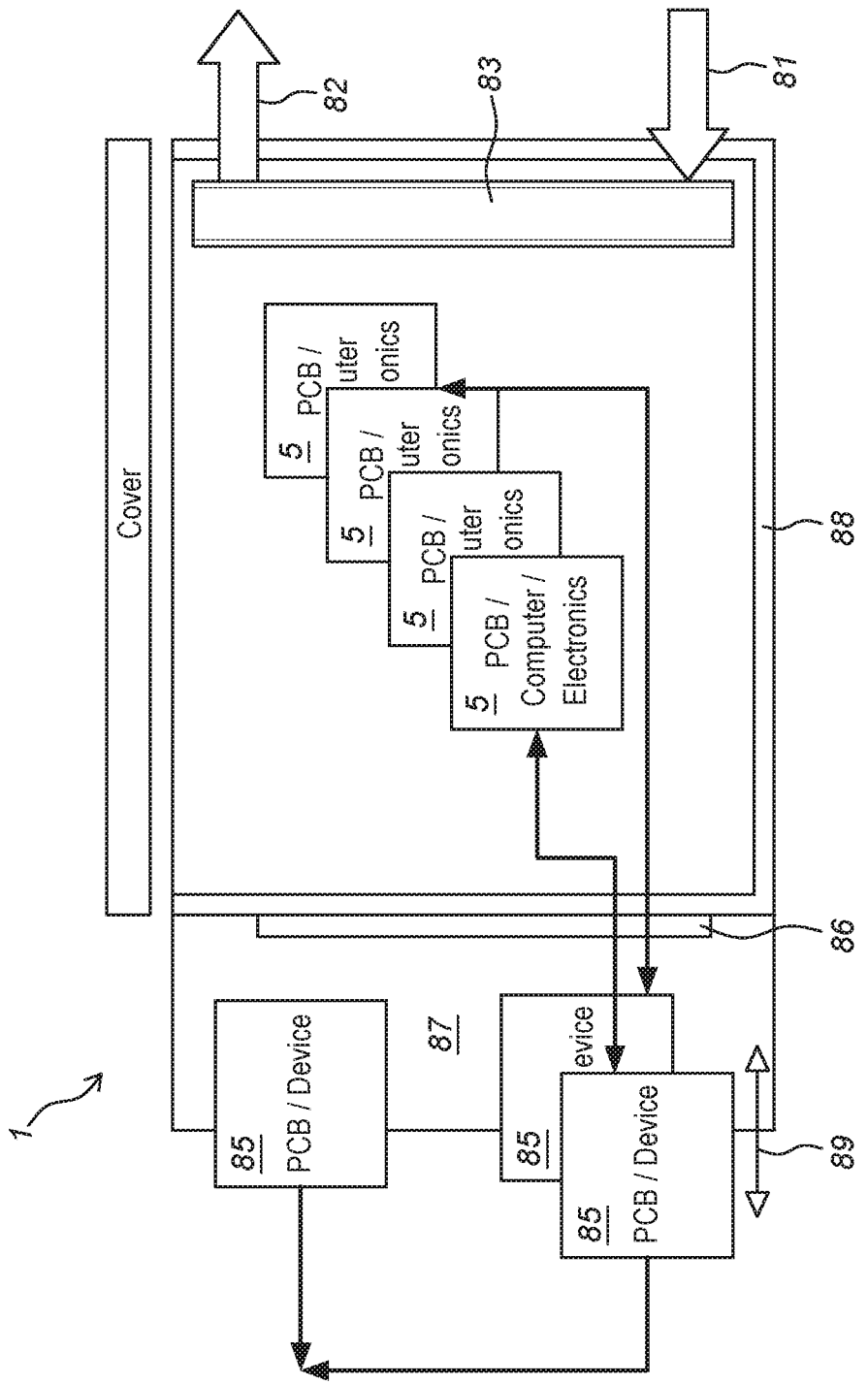
FIG. 8 shows yet another different embodiment of an immersive cooling unit having a non-immersive space.

FIGS. 7 and 8 show two embodiments of an immersive cooling unit according to the present invention, wherein the immersive cooling unit comprises a non-immersive space as described in the application. FIG. 7 thereto shows a first embodiment of the immersive cooling unit 1, wherein a non-immersive space 77 is provided. The non-immersive space 77 is in this embodiment defined by parts 77a, 77b, of the common housing 78 which protrude from the common housing 78. As such, the non-immersive space 77 or components therein are partially protected by said parts 77a, 77b. Within the common housing 78 a printed circuit board 10 is provided with a plurality of electronic components 5. The electronic components 5 of the printed circuit board 10 in the dielectric, or immersive cooling liquid are connected to a backplane printed circuit board 76. Said backplane printed circuit board 76 is located in the non-immersive space 77 and is connected to the other printed circuit board 10 in the immersive space via cables 73, 74. Such a cable 73, 74, may be a PCIe 3.0+ cable, or SATA, SAS, SFF-8643 cables, or the like. The electronic components 75 may connect to the backplane printed circuit board 76 via connecters provided on said printed circuit board 76. This allows for accessing the electronic components 75 without interfering with the immersive cooling liquid. Hence, the SSD/HDD or I/O expansion cards forming the electronic components 75 may be interchanged during operation. The main printed circuit board 10 may be provided with power via a different power or communication cable 14. The immersive space of the immersive cooling unit 1 may be connected to a cooling liquid input connector 71, and to a cooling liquid output connector 72, for fluidly connecting the immersive cooling unit 1 with a holder 15 according to the invention. FIG. 8 shows a slightly different embodiment of an immersive cooling unit 1, wherein the immersive cooling unit 1 also comprises a non-immersive space 87, which in this particular instance is defined by the backplane pcb 86 itself, which pcb is attached to an exterior side of the immersive cooling unit 1. One or more electronic devices 85, or printed circuit boards may be connected or connectable to the backplane pcb 86. The electronic components 85 of the non-immersive space 87 may thus be moved in a direction 89 from and towards the backplane pcb 86. Inside the immersive liquid the heat dissipating electronic components 5 are located, which generate the convective flow inside the common housing 88. A heat exchanger 83 is provided in the cooling channel, such that the immersive liquid is cooled by said heat exchanger 83. The heat exchanger 83 is connected to a cooling liquid supply connector 81, and to a cooling liquid discharge connector 82. The cooling liquid supply connector 81 may provide cold cooling liquid, such as water, glycol or the like, for absorbing or extracting heat (via the heat exchanger) from the immersive cooling liquid. The cooling liquid discharge connector 82 may discharge the hot cooling liquid, for example to a holder 15.

Figure 9:
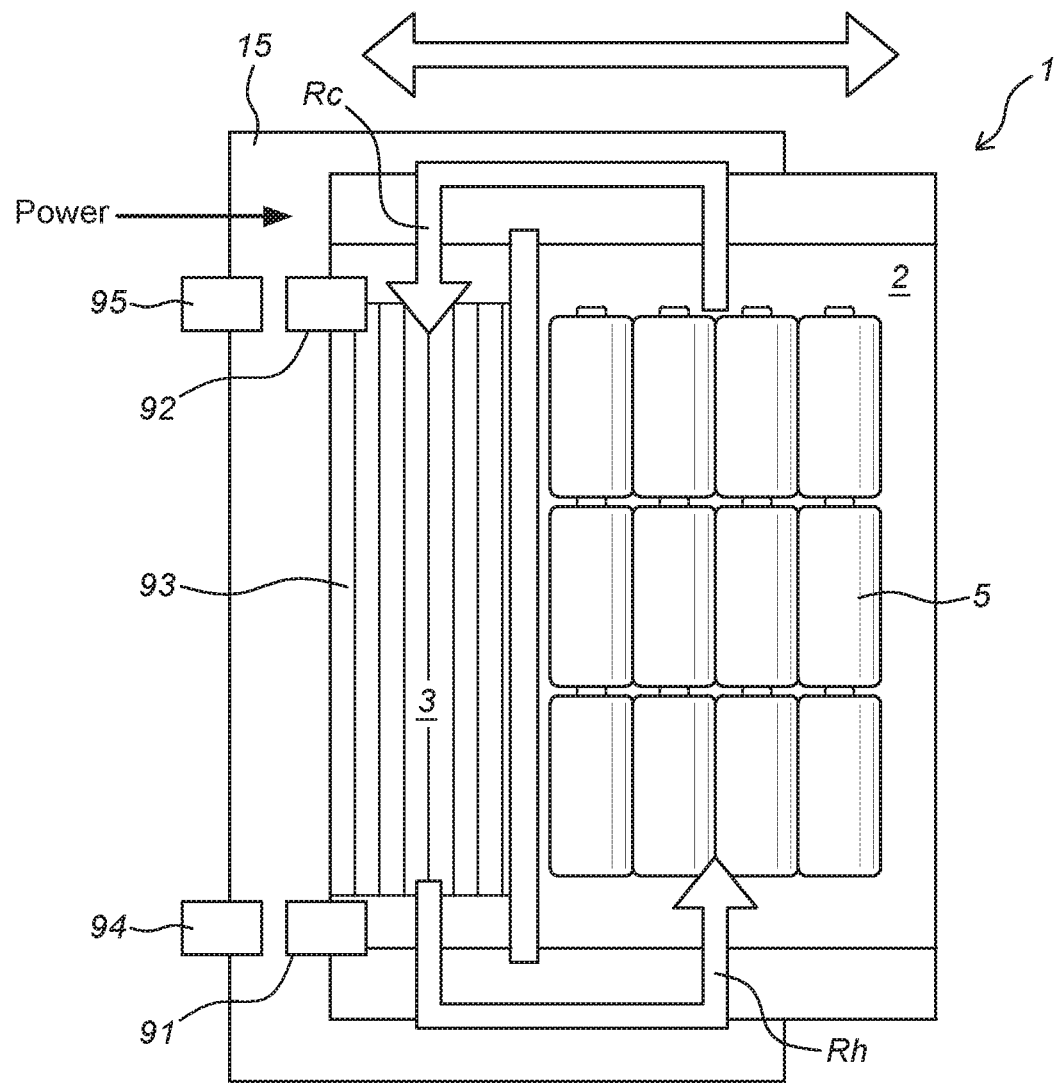
FIG. 9 depicts an alternative embodiment according to the invention.
Figure 10A:
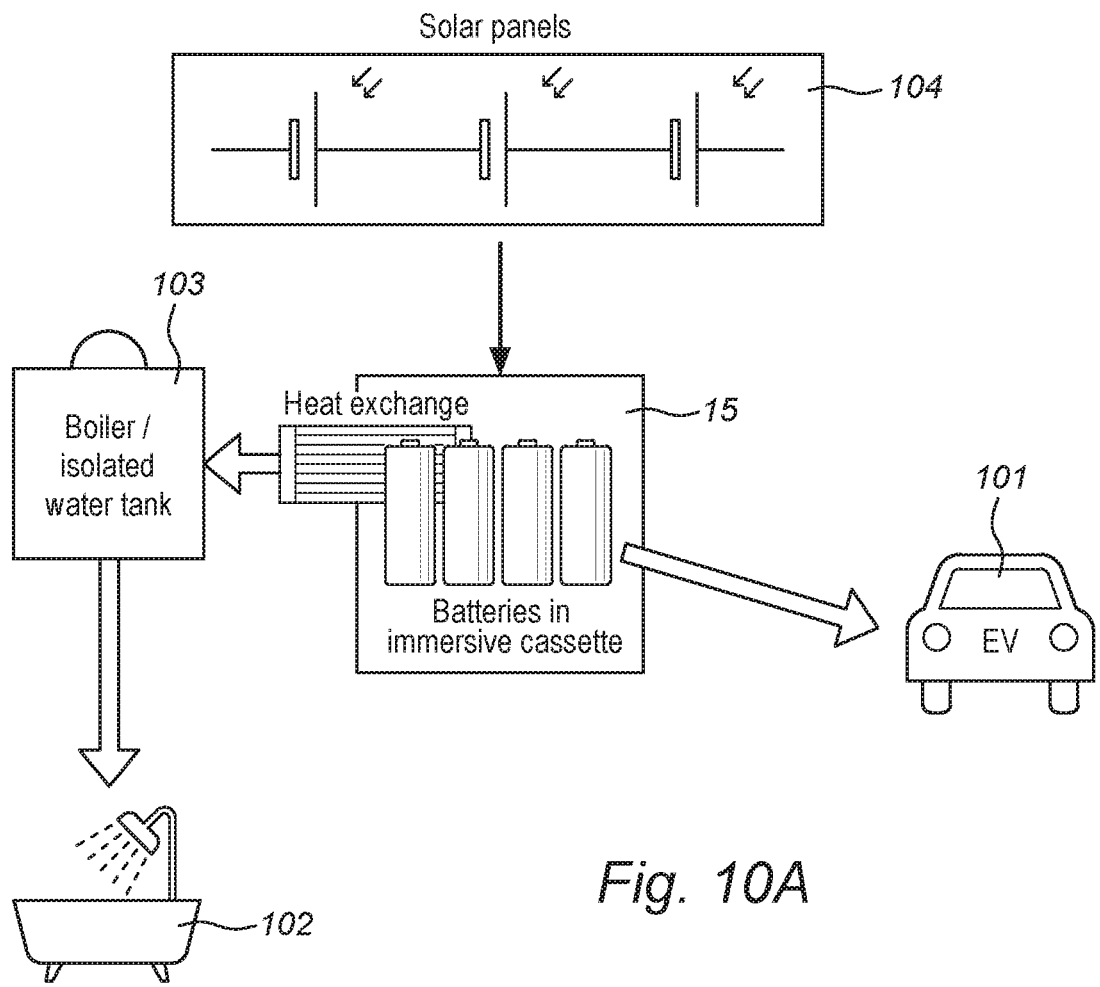
FIGS. 10A-10C depict different applications of embodiments according to the invention.
Figure 10C:
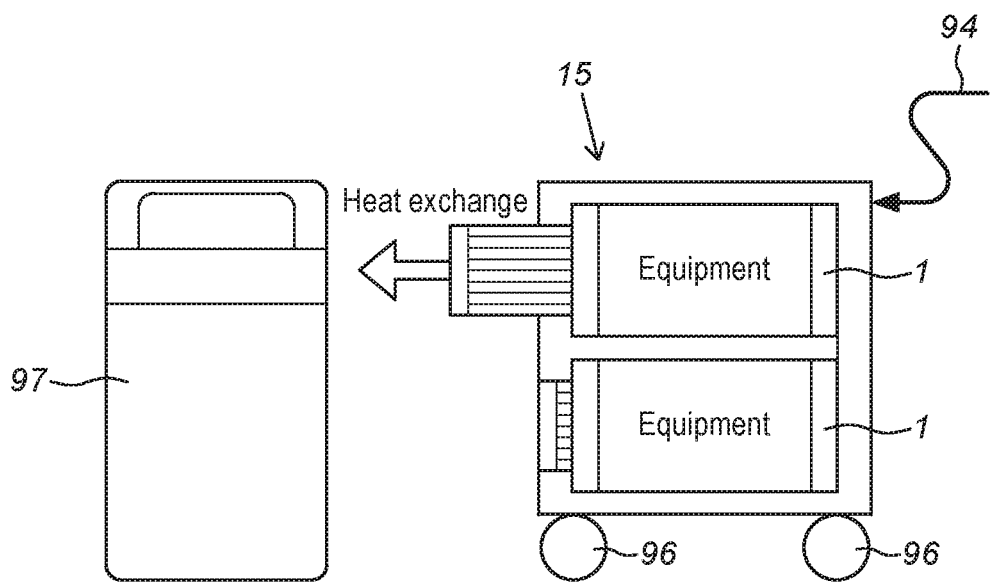
Figure 10B:
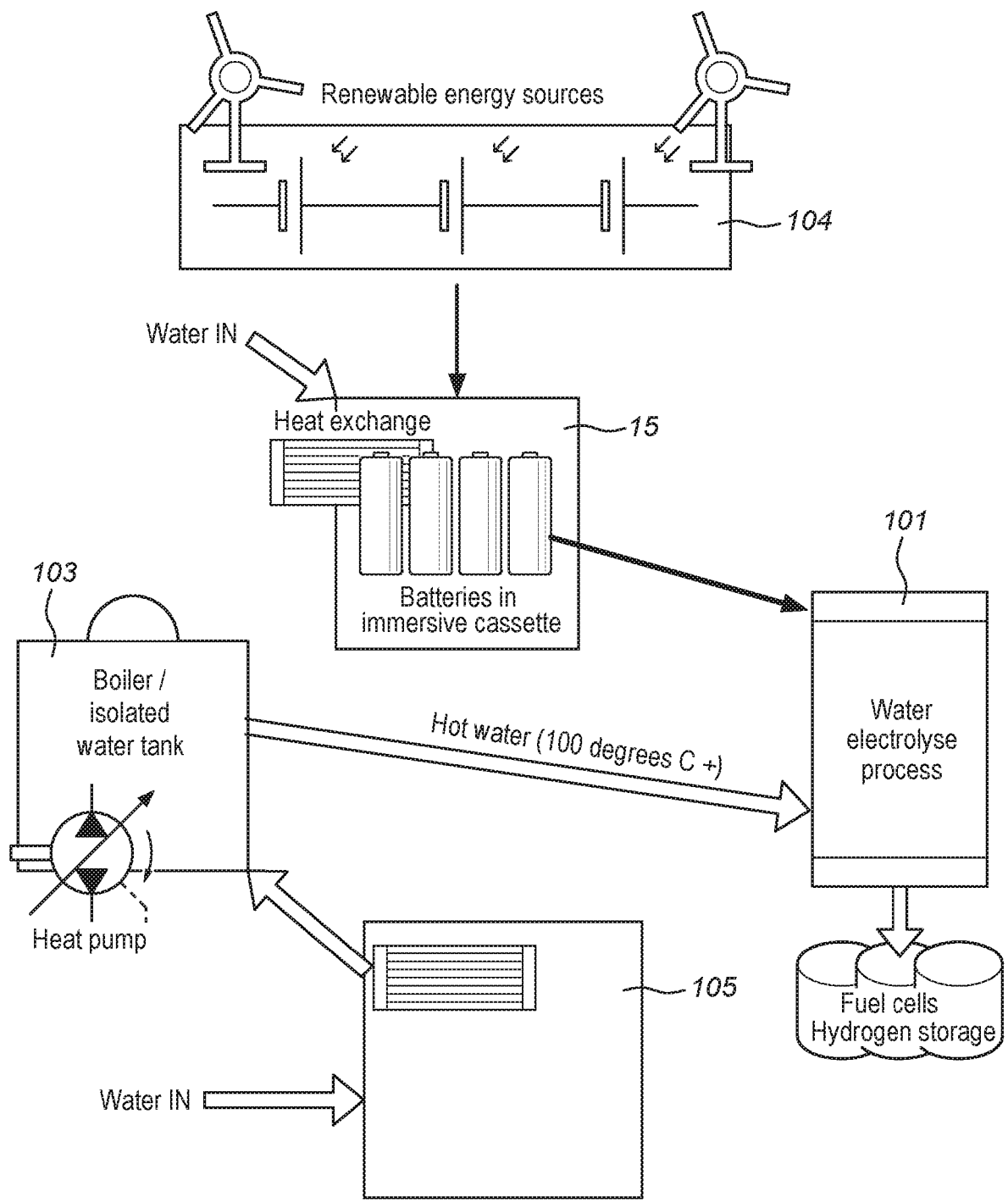

FIG. 9 shows an alternative embodiment of the holder 15 according to the invention. In this embodiment the immersive cooling unit 1 is provided with a plurality of battery cells or batteries 5 deposited in the heating channel 2 of the immersive space. The battery cells 5 generate heat when being discharged quickly, therewith initiating an upward flow component Rh of the immersive cooling liquid in the heating channel 2. The heated immersive cooling liquid is cooled down via heat exchanger 93, which cooling introduces a downward flow component Rc in the cooling channel 3. Via two dripless blind mating coupling 91, 92, the immersive cooling unit 1 is fluidly connected to the holder 15. This allows cooling liquid to be provided from the holder 15 towards the immersive cooling unit 1, in particular to a heat exchanger 93 in the cooling channel 3. Inside the heat exchanger 93 the cooling liquid heats up as immersive cooling liquid is cooled. The hot cooling liquid is discharged via dripless blind mating discharge connector 92 to the holder 15. The hot liquid may subsequently flow to a common hot cooling liquid channel, to which several cooling units 1 may discharge hot cooling liquid that was heated by the immersive cooling liquid of the various cooling units 1 inserted in the holder 15. The holder 15 may also comprise two connectors 94, 94 for fluidly connecting a holder 15 to a different system. Such a different system is shown in FIGS. 10A-10C. The holder connectors 94, 95 may be of the same type as provided for on the immersive cooling unit 1 or be of a different type.

FIG. 10A shows a first application of the immersive cooling unit 1 according to the invention. A holder 15, which is merely schematically depicted, comprises one or more immersive cooling units 1, each immersive cooling unit 1 provided with one or more battery cells. The batteries, or battery cells in the immersive cooling liquid may be charged via a renewable energy source 104, such as solar panels in this instance. Simultaneously, or once sufficiently charged, the batteries or cells may be used for charging an EV 101, preferably for fast charging said EV 101. During fast charging thereof, a lot of heat is generated by the batteries or the cells inside the immersive cooling liquid of an immersive cooling unit 1. Heat dissipated by the batteries or cells may be absorbed by the immersive cooling liquid and extracted via a heat exchanger, such as e.g. shown in FIG. 9. The extracted heat may thereafter be used in a different system, such as a boiler system 103, which allows the hot water to be used in a shower or bath 102. It is important to note that in this respect there are two different cooling liquids. One being the immersive liquid inside the immersive cooling unit 1, the other being the cooling liquid used in the cooling circuitry, which cooling circuitry may include the aforementioned heat exchanger through which said cooling liquid flows, this latter may be regular water or glycol or the like. FIG. 10B shows yet a different application of the holder 15 according to the invention. The holder, which comprises one or more immersive cooling units 1, each immersive cooling unit 1 provided with one or more battery cells. Again, the batteries or cells may be charged by means of renewable sources 104, such as wind energy in this instance. Once sufficiently charged, the electricity may be used to power a water electrolysis process 101, for generating hydrogen, which may be used for future purposes. Again, the hot cooling liquid of the cooling circuitry may be temporarily stored inside a boiler or insulated water tank 103. Said water stored in the tank 103 may be used for the electrolysis process 103, wherein the temperature of the water is typically around 100 degrees Celsius. Also, power from the battery cells 5 in the holder 15 may also be used for providing power to the electrolysis process.

Lastly, FIG. 10C shows yet another application. In this particular application the holder 15 is provided with wheels 96 to allow the holder 15 to be easily relocated or moved. A fluid supply connection 94 may be provided for providing cold cooling liquid to the holder 15. Inside the holder 15 two immersive cooling units 1 are provided. Each immersive cooling unit 1 is, in the heating channel thereof, provided with equipment. In particular medical equipment or monitoring equipment that requires cooling. Such equipment may be required in a hospital besides a hospital bed 97, such as equipment used for monitoring a heartbeat or similar. By cooling the medical and monitoring equipment with the immersive cooling unit 1 and holder according to the invention different benefits may be achieved. First of all, heat dissipated by the equipment may be reused for heating the hospital bed 97 by means of the heat extracted via the immersive cooling liquid. This may be achieved by passing the heated liquid through a bed 97. Secondly, the present solution for heating hospital beds 97 is essentially noise free, which is beneficial for the patient since noise may be disruptive or annoying. Where normally fans are used to cool the equipment, the present invention is in fact silent. This is due to the natural convective flow induced by the heat, hence not even a pump is required. Yet further, the patients may be more comfortable by heating the beds, which does not require additional power since the heat is reused from the already available equipment.

The above-described inventive concepts are illustrated by several illustrative embodiments. It is conceivable that individual inventive concepts may be applied without, in so doing, also applying other details of the described example. It is not necessary to elaborate on examples of all conceivable combinations of the above-described inventive concepts, as a person skilled in the art will understand numerous inventive concepts can be (re)combined in order to arrive at a specific application. Various embodiments of the immersive cooling unit or holder as described above and in the appended claims or other part of the description may be combined to form different embodiments. It is in particular conceivable that the embodiments described within this application directed to, but not limited to, battery cooling, battery cooling and reusing the generated heat in a boiler, more efficient electrolysis, cooling medical equipment in a more silent way, mobile use of the holders according to the invention, the cold plates of the holder and the coolant circuitry, may be applied separately from the present application, optionally in combination with one or more embodiments described in the application. It will be apparent that the invention is not limited to the working examples shown and described herein, but that numerous variants are possible within the scope of the attached claims that will be obvious to a person skilled in the art.

The invention claimed is:

1. An immersive cooling system for cooling electronic components, comprising:
  an immersive cooling unit, for cooling electronic components, comprising;
    at least one closed heating channel, defined by at least one circumferential heating channel wall having a start and an end, accommodating one or more printed circuit boards, wherein one or more heat dissipating electronic components are provided on each printed circuit board,
    at least one closed cooling channel, defined by at least one circumferential cooling channel wall, wherein a start of the cooling channel is connected to an end of the heating channel, and wherein an end of the cooling channel is connected to the start of the heating channel such that a closed circuit is formed between the channels,
    wherein the at least one heating and cooling channel are configured for holding an immersive liquid coolant, for cooling the electronic components, said coolant at least filling the channels and submerging the one or more printed circuit boards, wherein the channels each allow a coolant flow having at least a vertical component
  wherein
    an active heat exchanger is positioned in the cooling channel, said heat exchanger provided with an internal circuit for liquid cooling, and fluid circuitry for circulating such cooling liquid with the exterior side of said cooling channel wall or immersive cooling unit, and
  a holder, said holder comprising:
    at least one holding space formed by at least a holding bottom and at least one circumferential holding wall, wherein the at least one holding wall is dimensioned to receive the cooling unit, wherein the immersive cooling unit is inserted in the at least one holding space,
    fluid circuitry,
  wherein an exterior side of the immersive cooling unit and the holder are each provided with co-acting fluid connections, such that the fluid circuitry of the immersive cooling unit and the fluid circuitry of the holder are fluidly connected,
    a least one heat extracting unit, for actively extracting heat from cooling liquid of the fluid circuitry of the active heat exchanger.

2. The system according to claim 1, wherein the at least one heating channel and the at least one cooling channel are separated by a heat insulating wall, said heat insulating wall forming at least a part of the circumferential cooling channel wall and at least a part of the circumferential heating channel wall of the channels said insulating wall separates, wherein said insulating wall prevents heat exchange between said channels.

3. The system according to claim 2, wherein at least one heat insulating wall is connected to the one or more printed circuit boards or at least one battery.

4. The system according to claim 1, wherein the cooling unit comprises at least two closed cooling channels, each defined by at least one circumferential cooling channel wall, and wherein a start of each cooling channel is connected to an end of the heating channel, and wherein an end of each cooling channel is connected to the start of the heating channel such that a closed circuit is formed between the channels.

5. The system according to claim 1, wherein the one or more printed circuit boards are vertically accommodated in the heating channel, wherein the electronic components on the one or more printed circuit boards are arranged, in a direction from the start of the heating channel to the end of the heating channel, according to their heat generation during use, wherein the component generating the most heat is placed closest to the start of the heating channel.

6. The system according to claim 1, comprising a common housing, said housing comprising a bottom, a top cover, and a housing wall, wherein the circumferential heating channel wall and/or circumferential cooling channel wall form at least a part of the housing wall.

7. The system according to claim 6, wherein handles are provided to the top cover, for handling the cooling unit.

8. The system according to claim 1, wherein the liquid coolant is a dielectric fluid.

9. The system according to claim 1, further comprising a valve, wherein the valve provides an access to the closed circuit formed by the at least one heating and cooling channel.

10. The system according to claim 1, wherein at least one of the one or more printed circuit boards and/or a System on a Chip (SoC) is configured for measuring the temperature of an inserted cooling unit.

11. The system according to claim 1, wherein the holder comprises a plurality of holding spaces, each holding space:
formed by at least a holding bottom and at least one holding wall, wherein the at least one holding wall is dimensioned to receive an independent cooling unit, wherein a plurality of immersive cooling units are inserted in the plurality of holding spaces,
wherein the heat extracting unit is a central heat extracting unit, for actively extracting heat from the cooling liquid of the fluid circuitry of the active heat exchanger of each inserted cooling unit.

12. The system according to claim 11, wherein the holder is configured for independently and separately regulating the heat extraction rate and/or temperature of each inserted cooling unit.

13. The system according to claim 12, wherein the heat extraction rate and/or temperature of each inserted cooling unit is regulated based on measurements of an external or internal temperature of each inserted cooling unit.

14. The system according to claim 11, wherein each of the cooling units further comprises at least one connector, wherein the at least one connector is connected to the one or more printed circuit boards by at least one wire, for electronically connecting at least one of the one or more printed circuit boards to an external device and/or wherein the holder comprises a holding connector, wherein the holding connector is positioned to receive the connector of an inserted cooling unit, forming an electronic connection between the one or more printed circuit boards and the holder.

15. The system according to claim 1, wherein the holder, further comprises a guide, for guiding the unit into the at least one holding space.

16. The system according to claim 1, wherein at least a part of the heating channel wall and the cooling channel wall are insulated walls.

17. A method of using the system according to claim 1, for actively cooling the one or more heat dissipating electronic components.

* * * * *